(12) United States Patent
Kang et al.

(10) Patent No.: US 11,563,072 B2
(45) Date of Patent: Jan. 24, 2023

(54) DISPLAY DEVICE WITH CONNECTION LINE IN DISPLAY AREA CONNECTING DATA LINES TO PAD AREA

(71) Applicant: SAMSUNG DISPLAY CO., LTD., Yongin-si (KR)

(72) Inventors: Kinyeng Kang, Yongin-si (KR); Hyun Kim, Yongin-si (KR); Seungmin Song, Yongin-si (KR); Taehoon Yang, Yongin-si (KR); Sanghoon Lee, Yongin-si (KR); Seonbeom Ji, Yongin-si (KR); Jonghyun Choi, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 184 days.

(21) Appl. No.: 16/940,674

(22) Filed: Jul. 28, 2020

(65) Prior Publication Data
US 2021/0193775 A1  Jun. 24, 2021

(30) Foreign Application Priority Data
Dec. 18, 2019  (KR) .................. 10-2019-0169934

(51) Int. Cl.
*H01L 27/32* (2006.01)
*G09G 3/3233* (2016.01)

(52) U.S. Cl.
CPC ...... *H01L 27/3276* (2013.01); *H01L 27/3258* (2013.01); *G09G 3/3233* (2013.01); *G09G 2300/0809* (2013.01)

(58) Field of Classification Search
CPC ............ H01L 27/3276; H01L 27/3258; G09G 3/3233; G09G 2300/0809
See application file for complete search history.

(56) References Cited

U.S. PATENT DOCUMENTS

| 8,730,420 | B2 | 5/2014 | Lee et al. | |
| 9,257,493 | B2 | 2/2016 | Lee et al. | |
| 10,163,941 | B1* | 12/2018 | Lee | H01L 27/1259 |
| 10,431,604 | B2* | 10/2019 | Cho | H01L 27/3276 |
| 2008/0251787 | A1* | 10/2008 | Kim | H01L 22/32 |
| | | | | 257/48 |

(Continued)

FOREIGN PATENT DOCUMENTS

| CN | 108873510 A | 11/2018 |
| KR | 101103615 B1 | 1/2012 |

(Continued)

*Primary Examiner* — Lex H Malsawma
(74) *Attorney, Agent, or Firm* — Cantor Colburn LLP

(57) ABSTRACT

A display device includes a substrate including a display area in which a display element is arranged and a non-display area having a pad area outside the display area, a first thin-film transistor arranged in the display area of the substrate and including a first semiconductor layer and a first gate electrode insulated from the first semiconductor layer, a first voltage line which extends in a first direction on the first gate electrode, a data line apart from the first voltage line and which extends in the first direction, connection lines which connects the data line to a pad in the pad area in the display area, and a conductive layer arranged in a layer between the first voltage line and the data line.

20 Claims, 25 Drawing Sheets

(56) References Cited

U.S. PATENT DOCUMENTS

| | | | |
|---|---|---|---|
| 2010/0079717 A1* | 4/2010 | Park | G09G 3/20 |
| | | | 349/152 |
| 2010/0182303 A1 | 7/2010 | Takasugi et al. | |
| 2012/0262658 A1* | 10/2012 | Lee | G02F 1/1345 |
| | | | 174/250 |
| 2017/0288002 A1* | 10/2017 | Kim | H01L 27/3265 |
| 2018/0130856 A1* | 5/2018 | Kim | H01L 51/0097 |
| 2018/0204895 A1* | 7/2018 | Lin | G09G 3/3291 |
| 2019/0088733 A1* | 3/2019 | Cho | H01L 51/5253 |
| 2019/0103455 A1* | 4/2019 | Song | H01L 27/124 |
| 2020/0027901 A1 | 1/2020 | Cho et al. | |
| 2020/0381506 A1* | 12/2020 | Kang | H01L 27/3276 |
| 2020/0388230 A1* | 12/2020 | Lee | G09G 3/3275 |
| 2021/0043710 A1* | 2/2021 | Yun | H01L 27/3262 |

FOREIGN PATENT DOCUMENTS

| | | |
|---|---|---|
| KR | 101383707 B1 | 4/2014 |
| KR | 1020180072440 A | 6/2018 |
| KR | 101980757 B1 | 5/2019 |

\* cited by examiner

DISPLAY DEVICE WITH CONNECTION LINE IN DISPLAY AREA CONNECTING DATA LINES TO PAD AREA

This application claims priority to Korean Patent Application No. 10-2019-0169934, filed on Dec. 18, 2019, and all the benefits accruing therefrom under 35 U.S.C. § 119, the content of which in its entirety is herein incorporated by reference.

BACKGROUND

1. Field

One or more exemplary embodiments relate to a display device.

2. Description of Related Art

As the field of a display device that visually represents a variety of pieces of electrical signal information has rapidly developed, a variety of types of display devices having excellent characteristics, such as a small size, low weight, and low power consumption, have been introduced. As physical buttons and the like have been removed from the front surfaces of the display device, dead spaces of the display device have been reduced and a display area of the display device have increased in size.

SUMMARY

One or more exemplary embodiments include a display device that may prevent the quality of an image to be displayed on the display device from being degraded by controlling coupling between lines. However, this objective is just an example, and the scope of the present disclosure is not limited thereby.

Additional aspects will be set forth in part in the description which follows and, in part, will be apparent from the description, or may be learned by practice of the presented exemplary embodiments of the disclosure.

According to one or more exemplary embodiments, a display device includes a substrate including a display area in which a display element is arranged and a non-display area including a pad area outside the display area, a first thin-film transistor arranged in the display area and including a first semiconductor layer and a first gate electrode insulated from the first semiconductor layer, a first voltage line which extends in a first direction on the first gate electrode, a data line apart from the first voltage line and which extends in the first direction, connection lines arranged in the display area and which connects the data line to a pad in the pad area, and a conductive layer arranged in a layer between the first voltage line and the data line. Each of the connection lines includes a first portion and a second portion, the first portion extends in the first direction and is arranged in the same layer as the data line, the second portion extends in a second direction crossing the first direction and arranged on the same layer as the conductive layer, and the first portion and the second portion are electrically connected to each other in the display area.

In an exemplary embodiment, the display device may further include a second voltage line in a layer between the first gate electrode and the first voltage line, and the second voltage line may extend in the second direction and overlap the second portion of the connection line in a plan view.

In an exemplary embodiment, the conductive layer may be electrically connected to the second voltage line.

In an exemplary embodiment, the display device may further include a second thin-film transistor including a second semiconductor layer and a second gate electrode insulated from the second semiconductor layer, a node electrode which electrically connects the first gate electrode of the first thin-film transistor to a first end of the second semiconductor layer of the second thin-film transistor, and a connection electrode which electrically connects the second voltage line to a second end of the second semiconductor layer of the second thin-film transistor.

In an exemplary embodiment, the display device may further include an electrode layer located on and overlapping the first gate electrode and arranged in the same layer as the second voltage line.

In an exemplary embodiment, the first voltage line may be electrically connected to the electrode layer.

In an exemplary embodiment, the display device may further include a first planarization layer between the first voltage line and the second portion of the connection line and a second planarization layer between the second portion and the first portion of the connection line.

In an exemplary embodiment, the conductive layer may overlap the first voltage line in the plan view, and the first portion of the connection line may overlap the conductive layer.

In an exemplary embodiment, part of the data line may overlap the conductive layer in the plan view.

In an exemplary embodiment, each of the connection lines may further include a third portion extending in the first direction in the display area and connected to the pad, and the data line may be connected to the first portion in the non-display area.

According to one or more exemplary embodiments, a display device includes a substrate including a display area in which a display element is arranged, and a non-display area including a pad area outside the display area, a first thin-film transistor arranged in the display area and including a first semiconductor layer and a first gate electrode insulated from the first semiconductor layer, a first voltage line which extends in a first direction on the first gate electrode, a data line apart from the first voltage line and which extends in the first direction, connection lines arranged in the display area and which connects the data line to a pad in the pad area, and a conductive layer arranged in a layer between the first voltage line and the data line, where the connection lines are arranged in the same layer as the conductive layer and each of the connection lines includes a first portion extending in the first direction and a second portion extending in a second direction crossing the first direction.

In an exemplary embodiment, the display device may further include a second voltage line in a layer between the first gate electrode and the first voltage line, and the second voltage line may extend in the second direction and overlap the second portion of the connection line in a plan view.

In an exemplary embodiment, the conductive layer may be electrically connected to the second voltage line.

In an exemplary embodiment, the display device may further include a second thin-film transistor including a second semiconductor layer and a second gate electrode insulated from the second semiconductor layer, a node electrode which electrically connects the first gate electrode of the first thin-film transistor to a first end of the second semiconductor layer of the second thin-film transistor, and a connection electrode which electrically connects the second voltage line to a second end of the second semiconductor layer of the second thin-film transistor.

In an exemplary embodiment, the display device may further include an electrode layer located on and overlapping the first gate electrode and arranged in the same layer as the second voltage line.

In an exemplary embodiment, the first voltage line may be electrically connected to the electrode layer.

In an exemplary embodiment, the display device may further include a first planarization layer between the first voltage line and the connection line and a second planarization layer between the connection line and the data line.

In an exemplary embodiment, the first portion of the connection line may overlap the first voltage line in the plan view.

In an exemplary embodiment, part of the data line may overlap the conductive layer in the plan view.

In an exemplary embodiment, each of the connection lines may further include a third portion extending in the first direction in the display area and connected to the pad, and the data line may be connected to the first portion in the non-display area.

Other aspects, features, and advantages than the above-described aspects, features, and advantageous will be apparent from a detailed description for implementing the following disclosure, the claims, and the drawings.

BRIEF DESCRIPTION OF THE DRAWINGS

The above and other aspects, features, and advantages of certain exemplary embodiments of the disclosure will be more apparent from the following description taken in conjunction with the accompanying drawings, in which.

DETAILED DESCRIPTION

Figure 1:
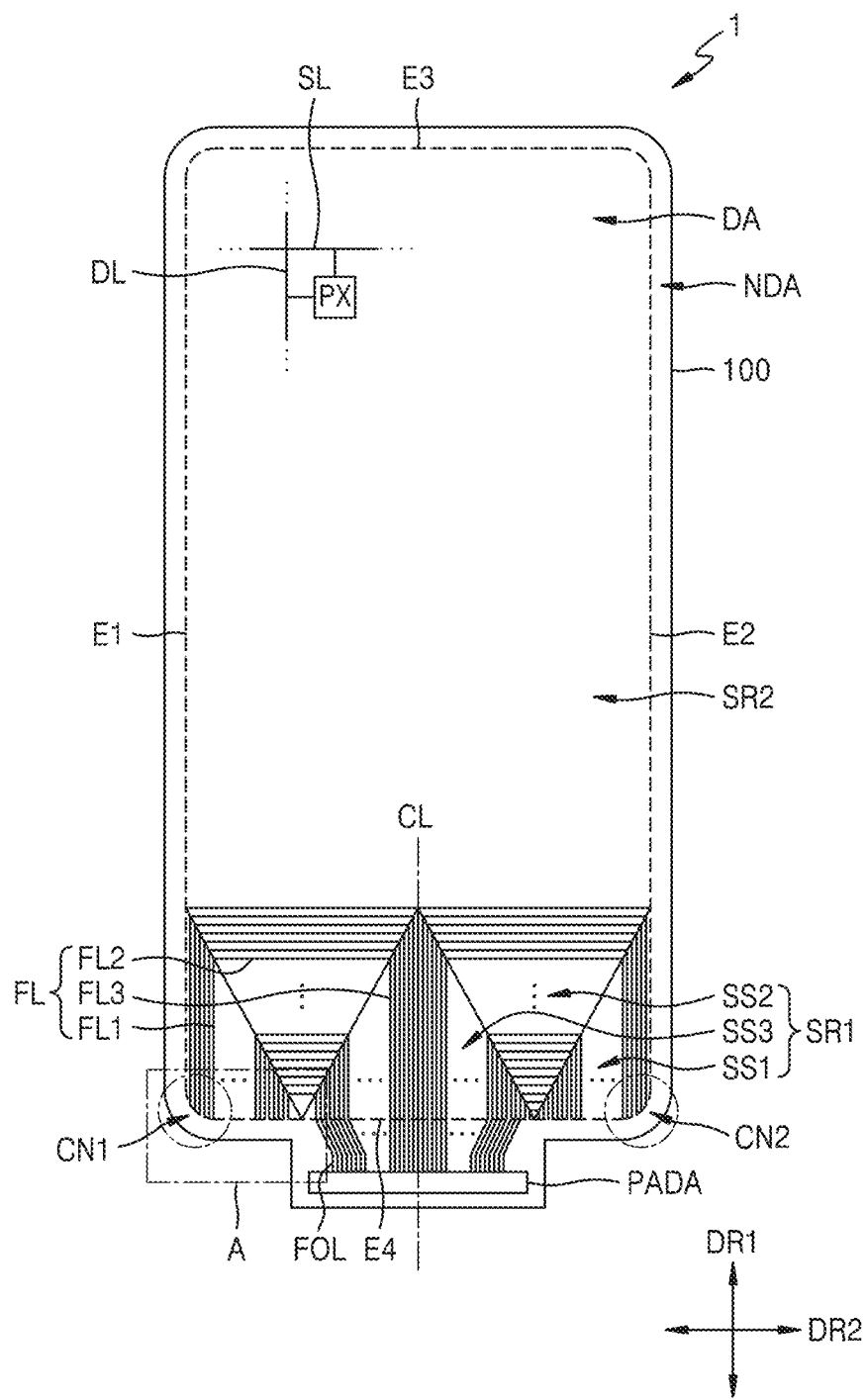
FIG. 1 is a plan view schematically illustrating an example of a display device according to an exemplary embodiment.

Reference will now be made in detail to exemplary embodiments, examples of which are illustrated in the accompanying drawings, wherein like reference numerals refer to like elements throughout. In this regard, the present exemplary embodiments may have different forms and should not be construed as being limited to the descriptions set forth herein. Accordingly, the exemplary embodiments are merely described below, by referring to the figures, to explain aspects of the present description.

It will be understood that although the terms "first," "second," etc. may be used herein to describe various elements, these elements should not be limited by these terms. These elements are only used to distinguish one element from another.

As used herein, the singular forms "a," "an" and "the" are intended to include the plural forms as well, unless the context clearly indicates otherwise.

It will be further understood that the terms "comprises" and/or "comprising" used herein specify the presence of stated features or elements, but do not preclude the presence or addition of one or more other features or elements.

It will be understood that when a layer, region, or element is referred to as being "formed on," another layer, region, or element, it may be directly or indirectly formed on the other layer, region, or element. That is, for example, intervening layers, regions, or elements may be present.

Sizes of elements in the drawings may be exaggerated or reduced for convenience of explanation. In other words, since sizes and thicknesses of elements in the drawings are arbitrarily illustrated for convenience of explanation, the following exemplary embodiments are not limited thereto.

When a certain exemplary embodiment may be implemented differently, a specific process order may be performed differently from the described order. For example, two consecutively described processes may be performed substantially at the same time or performed in an order opposite to the described order.

It will be understood that when a layer, region, or element is referred to as being "connected to," another layer, region, or element, it may be directly or indirectly connected to the other layer, region, or element. That is, for example, intervening layers, regions, or elements may be present. For example, it will be understood that when a layer, region, or element is referred to as being "electrically connected to," another layer, region, or element, it may be directly or indirectly electrically connected to the other layer, region, or element. That is, for example, intervening layers, regions, or elements may be present.

In the present specification, "A and/or B" represents A, B, or A and B. Also, in the present specification, "at least one of A and B" represents A, B, or A and B.

In the following exemplary embodiments, the meaning of a line "extending in a first direction or second direction" includes that the line extends in a rectilinear form but also in a zigzag or curved form along the first direction or second direction.

In the following exemplary embodiments, when the term "on a plane" is referred, it will be understood that an object is seen from above. Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below. When the term "cross-sectional" is referred, it will be understood that a cross-section obtained by cutting the vertically is seen sideways. In the following exemplary embodiments, it will be understood that when a first element "overlaps" a second element, the first element is located on or under the second element.

A display device that is a device for displaying an image may include a liquid crystal display ("LCD") device, an electrophoretic display device, an organic light-emitting display device, an inorganic electroluminescent ("EL") display device, a field emission display ("FED") device, a surface-conduction electron-emitter display device, a quantum dot display device, a plasma display device, or a cathode ray display device. Hereinafter, an organic light-emitting display device will be described as an example of a display device. However, exemplary embodiments of the present disclosure may be applied to a variety of types of display devices described above.

Figure 2:
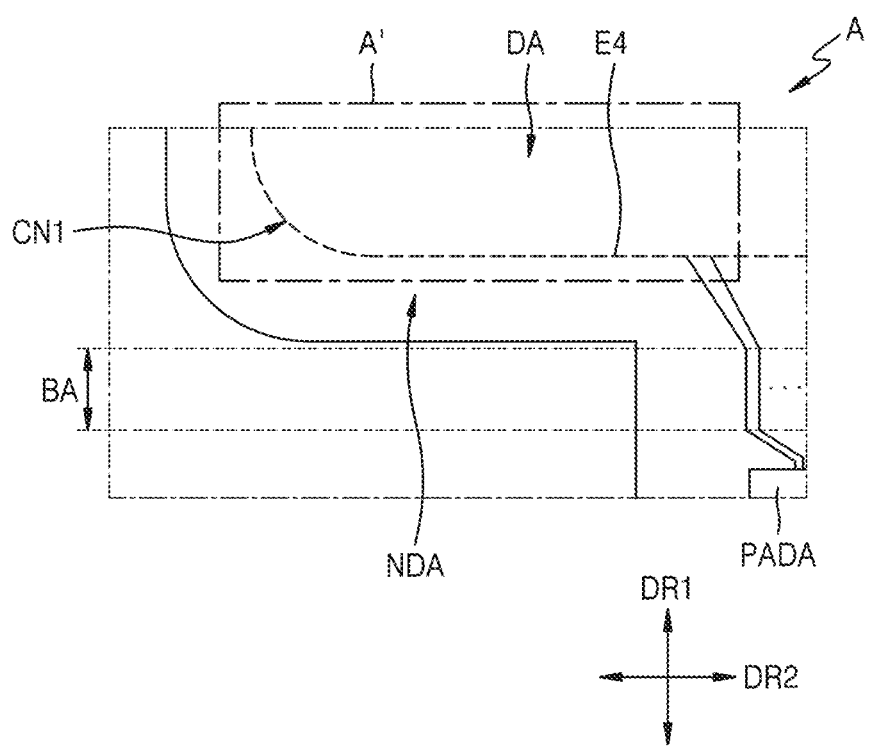
FIG. 2 is an enlarged view schematically illustrating region A of FIG. 1.
Figure 3:
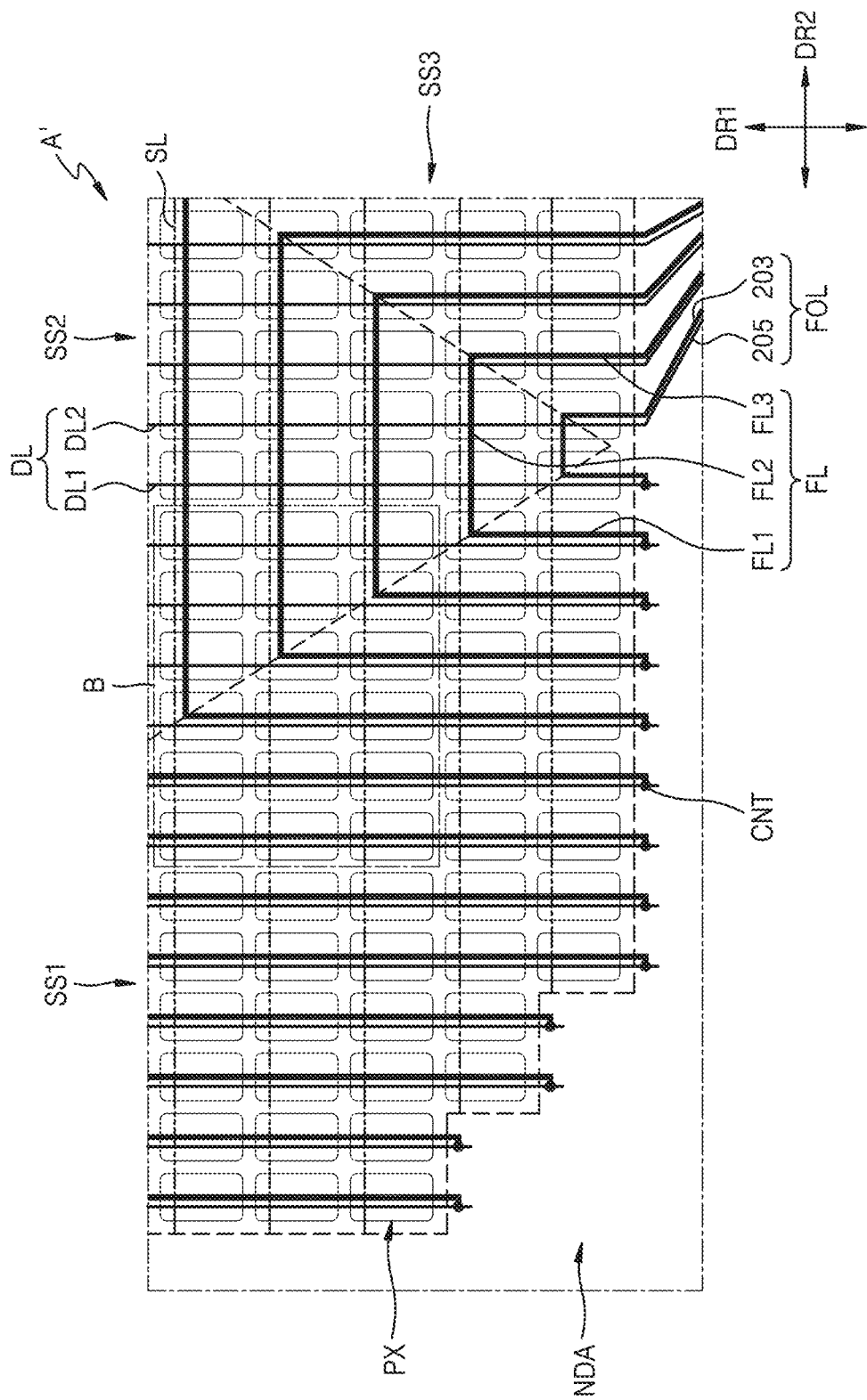
FIG. 3 is a partially-enlarged plan view of region A' of FIG. 2.

FIG. 1 is a plan view schematically illustrating an example of a display device according to an exemplary embodiment. FIG. 2 is an enlarged view schematically illustrating region A of FIG. 1, and FIG. 3 is a partially-enlarged plan view of region A' of FIG. 2.

Referring to FIG. 1, a substrate 100 of a display device 1 according to an exemplary embodiment of the present disclosure may include a display area DA in which a pixel PX including a display element is arranged, and a non-display area NDA including a pad area PADA outside the display area DA.

Edges of the display area DA may roughly have a similar shape to a rectangular or square shape. A first corner CN1 of the edges of the display area DA may have a rounded shape. In detail, the display area DA may include a first edge E1 and a second edge E2 that face each other, and a third edge E3 and a fourth edge E4 that are located between the first edge E1 and the second edge E2 and face each other. The pad area PADA is adjacent to the fourth edge E4 of the first through fourth edges E1, E2, E3, and E4. In this case, the first corner CN1 having the rounded shape connects the first edge E1 to the fourth edge E4. A second corner CN2 of the edges of the display area DA may also have a rounded shape in addition to the first corner CN1. The second corner CN2 connects the second edge E2 to the fourth edge E4. Also, the display area DA may have a rounded shape even in the other portions than the edges thereof.

Each pixel PX may emit red, green, blue, or white light, for example, and may include an organic light-emitting diode OLED, for example. Also, each pixel PX may further include an element, such as a thin-film transistor ("TFT"), a capacitor, or the like.

A pixel PX used herein represents a sub-pixel that emits light of any one of red, green, blue, and white colors, described above.

Signal lines configured to apply electrical signals to a plurality of pixels PX may include a plurality of scan lines SL and a plurality of data lines DL. Each of the plurality of data lines DL may extend in a first direction DR1, and each of the plurality of scan lines SL may extend in a second direction DR2. The plurality of scan lines SL may be arranged in a plurality of rows, for example, and may be configured to transmit scan signals to the pixels PX, and the plurality of data lines DL may be arranged in a plurality of columns, for example, and may be configured to transmit data signals to the pixels PX. Each of the plurality of pixels PX may be connected to at least one corresponding scan line SL of the plurality of scan lines SL and a corresponding data line DL of the plurality of data lines DL.

Connection lines FL may be configured to connect signal lines in the display area DA to a pad arranged in the pad area PADA of the non-display area NDA. In detail, the connection lines FL may be connected to fan-out lines FOL in the non-display area NDA, and the fan-out lines FOL may be connected to the pad in the pad area PADA.

The connection lines FL may be arranged in the display area DA.

In an exemplary embodiment, the connection lines FL arranged on the left side of a virtual central line CL passing approximately the center of the display area DA in the second direction DR2 as shown in FIG. 1 and the connection lines FL arranged on the right side of the central line CL may be approximately bisymmetrical with each other with respect to the central line CL.

Each of the connection lines FL may include a first portion FL1 and a third portion FL3 extending in the first direction DR1, and a second portion FL2 extending in the second direction DR2. The second portion FL2 may be configured to connect the first portion FL1 to the third portion FL3. The first portion FL1, the second portion FL2, and the third portion FL3 may be integrally formed. The third portion FL3 may be arranged adjacent to the central line CL, and the first portion FL1 may be arranged adjacent to the first corner CN1 or the second corner CN2. The first portion FL1 may extend from the fourth edge E4 and may extend in the first direction DR1. The second portion FL2 may be bent from the first portion FL1, may extend towards the central line CL from the first edge E1 or the second edge E2 and may extend in the second direction DR2. The third portion FL3 may extend towards the fourth edge E4 facing the pad area PADA, approaching to the pad area PADA and may extend in the first direction DR1.

The display area DA may be divided into a plurality of regions depending on whether the connection lines FL are arranged in the region. For example, the display area DA may include a first region SR1 in which the connection lines FL are arranged, and a second region SR2 that is the other region than the first region SR1. The second region SR2 may be a region in which the connection lines FL are not arranged.

The first region SR1 may be divided into a plurality of sub-regions according to an extension direction of the connection lines FL. For example, the first region SR1 may include a first sub-region SS1 in which first portions FL1 of the connection lines FL are arranged, a second sub-region SS2 in which second portions FL2 of the connection lines FL are arranged, and a third sub-region SS3 in which third portions FL3 of the connection lines FL are arranged. Each of the first sub-region SS1, the second sub-region SS2, and the third sub-region SS3 at the right side of the central line CL may be approximately symmetrical with the first sub-region SS1, the second sub-region SS2, and the third sub-region SS3 at the left side of the central line CL.

The non-display area NDA may surround the display area DA. The non-display area NDA is an area in which the pixels PX are not arranged, and may include the pad area PADA that is an area to which a variety of types of electronic elements or printed circuit boards ("PCBs") are electrically connected, and a voltage line configured to supply power for driving the display element may be located in the non-display area NDA. A plurality of pads may be provided in the pad area PADA. The plurality of pads may be electrically connected to a data driver. In an exemplary embodiment, the data driver for supplying data signals may be located on a film electrically connected to pads in the pad area PADA by using a chip on film ("COF") method. In another exemplary embodiment, the data driver may be directly located on the substrate 100 by using a chip on glass ("COG") or chip on plastic ("COP") method.

The fan-out lines FOL may be arranged in the non-display area NDA. The fan-out lines FOL may be connected to signal lines in the display area DA and may be configured to transmit signals from the pad area PADA. In the present exemplary embodiment, it is illustrated that at least part of the fan-out lines FOL may be connected to the connection lines FL.

FIG. 1 is a plan view showing a state that the substrate 100 is not bent. In an electronic device, such as a finally-manufactured display device or a smart phone including a display device, part of the substrate 100 may be bent so as to minimize the area of the non-display area NDA recognized by a user.

Referring to FIG. 2, the non-display area NDA may include a bendable area BA, and the bendable area BA may be between the pad area PADA and the display area DA. In this case, the substrate 100 may be bent in the bendable area BA, such that at least part of the pad area PADA may overlap the display area DA in the plan view. In a bent state, the display area PADA does not cover the display area DA in the plan view, and a bending direction is set such that the pad area PADA is behind the display area DA in the plan view. Thus, the user recognizes that the display area DA occupies most of the display device in the plan view.

FIG. 3 illustrates part of the first corner CN1. The display device 1 according to an exemplary embodiment or an electronic device including the same is recognized to have a rounded shape, i.e., a curved shape when the user observes the display device 1 in a general usage environment (i.e., observed with the naked eye). However, in an observation environment in which the first corner CN1 is enlarged and lines having widths of several micrometers or several tens of micrometers may be observed as shown in FIG. 3, it will be recognized that the first corner CN1 has a rectilinear (step) shape in which every part of the first corner CN1 is parallel to the first direction DR1 or the second direction DR2. Even when the first corner CN1 is observed as enlarged such that it is recognized that the first corner CN1 has a rectilinear shape in which every part of the first corner CN1 is parallel to the first direction DR1 or the second direction DR2 as shown in FIG. 3, in the general usage environment (i.e., observed with the naked eye) it will be recognized that the first corner CN1 has a rounded shape, i.e., a curved shape. Thus, when the first corner CN1 and the second corner CN2 are observed to have rounded shapes in the general usage environment, this may include both the case where they have substantially rounded shapes and the case where they have rectilinear shape.

Referring to FIG. 3, the data lines DL may include first data lines DL1 and second data lines DL2. The first data lines DL1 may be data lines connected to the connection lines FL. The second data lines DL2 may be data lines other than the first data lines DL1.

Also, the fan-out lines FOL may include first fan-out lines 203 and second fan-out lines 205. The first fan-out lines 203 may be fan-out lines connected to the connection lines FL. The second fan-out lines 205 may be fan-out lines other than the first fan-out lines 203.

The connection lines FL configured to transmit electrical signals to be supplied from the pad area PADA to signal lines connected to the pixels PX may be arranged in the display area DA. For example, the connection lines FL may be connected to the first data lines DL1 and may transmit data signals supplied from the pads in the pad area PADA to the first data lines DL1. Each of the connection lines FL may be located in a different layer from the scan lines SL and the data lines DL of the pixel PX.

The first portion FL1 of each of the connection lines FL may be in parallel with the first data lines DL1, and part of the first portion FL1 may overlap the first data lines DL1, or the first portion FL1 may be adjacent to the first data lines DL1. The first portion FL1 of each of the connection lines FL may extend in parallel with the first data lines DL1 arranged as a plurality of columns. The second portion FL2 of each of the connection lines FL may be in parallel with the scan lines SL, and part of the second portion FL2 may overlap the scan lines SL, or the second portion FL2 may be adjacent to the scan lines SL. The second portion FL2 of each of the connection lines FL may extend in parallel with the scan lines SL arranged as a plurality of rows. The third portion FL3 of each of the connection lines FL may be in parallel with the second data lines DL2, and part of the third portion FL3 may overlap the second data lines DL2, or the third portion FL3 may be adjacent to the second data lines DL2. The third portion FL3 of each of the connection lines FL may extend in parallel with the second data lines DL2 arranged as a plurality of columns.

The column in which the first portion FL1 of each of the connection lines FL is arranged, and the column in which the third portion FL3 of each of the connection lines FL is arranged, may be apart from each other by at least one column distance between the pixels PX. The first portions FL1 of a pair of adjacent connection lines FL may be apart from each other by at least one column distance between the pixels PX. The third portions FL3 of a pair of adjacent connection lines FL may be apart from each other by at least one column distance between the pixels PX. The second portions FL2 of a pair of adjacent connection lines FL may be apart from each other by at least one row distance between the pixels PX.

One end of each of the connection lines FL may be connected to the first data lines DL1, and the other end thereof may be connected to the first fan-out line 203. One end of the first fan-out line 203 may be connected to the other end of the connection line FL, and the other end of the first fan-out line 203 may be connected to the pad in the pad area PADA. Also, the first portion FL1 of the connection line FL may be electrically connected to the first data line DL1 at a contact part CNT in the non-display area NDA. In an exemplary embodiment, the first fan-out line 203 may be a portion in which the third portion FL3 extends in the non-display area NDA. In another exemplary embodiment, the first fan-out line 203 that is a separate line located in a different layer from the connection line FL, may be electrically connected to the third portion FL3 of the connection line FL in the non-display area NDA.

One end of the second fan-out line 205 may be connected to the second data line DL2, and the other end thereof may be connected to the pad in the pad area PADA. In an exemplary embodiment, the second fan-out line 205 may be a portion in which the second data line DL2 extends in the non-display area NDA. In another exemplary embodiment, the second fan-out line 205 that is a separate line located in a different layer from the second data line DL2, may be electrically connected to the second data line DL2 in the non-display area NDA.

As described above, the connection lines FL may be arranged in the display area DA so as to reduce the area of the non-display area NDA that surrounds the first corner CN1 or the second corner CN2. In a case that the signal lines in the display area DA extend in the display area DA and are connected to the fan-out lines FOL at areas around the first corner CN1 or the second corner CN2 in the non-display area NDA, the area of the fan-out lines FOL is increased such that the area of the non-display area NDA may be increased. In an exemplary embodiment according to the invention, the connection lines FL connected to the signal lines may pass through the display area DA such that the area of the fan-out line FOL in the non-display area NDA may be minimized. Thus, the area of the non-display area NDA may be reduced.

Figure 4:
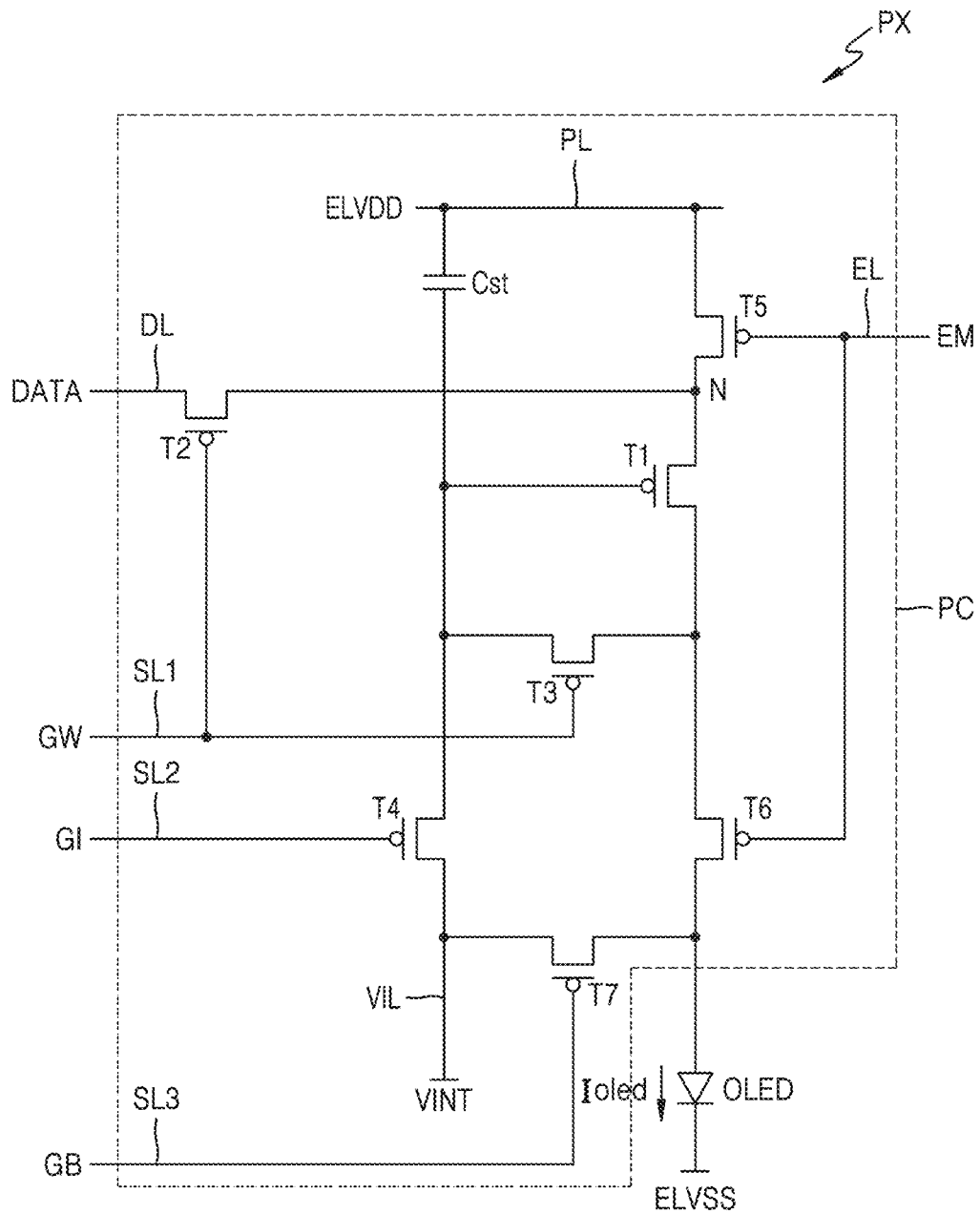
FIG. 4 is an equivalent circuit diagram showing a pixel arranged on a display panel according to an exemplary embodiment.

FIG. 4 is an equivalent circuit diagram showing a pixel arranged on a display panel according to an exemplary embodiment.

Referring to FIG. 4, signal lines SL1, SL2 SL3, EL, and DL, an initialization voltage line VIL and a power supply voltage line PL are provided in each pixel PX. In another exemplary embodiment, at least one of the signal lines SL1, SL2, SL3, EL, and DL, the initialization voltage line VIL and/or the power supply voltage line PL may be shared with adjacent pixels.

The signal lines may include a first scan line SL1 for transmitting a first scan signal GW, a second scan line SL2 for transmitting a second scan signal GI, a third scan line SL3 for transmitting a third scan signal GB, an emission control line EL for transmitting an emission control signal EM, and a data line DL for transmitting a data signal DATA. The third scan line SL3 may correspond to the second scan line SL2 in the next row, and the third scan signal GB may correspond to the second scan signal GI in the next row.

The power supply voltage line PL may be configured to transmit a first power supply voltage ELVDD to a first transistor T1, and the initialization voltage line VIL may be configured to transmit an initialization voltage VINT for initializing the first transistor T1 and the organic light-emitting diode OLED.

Figure 6:
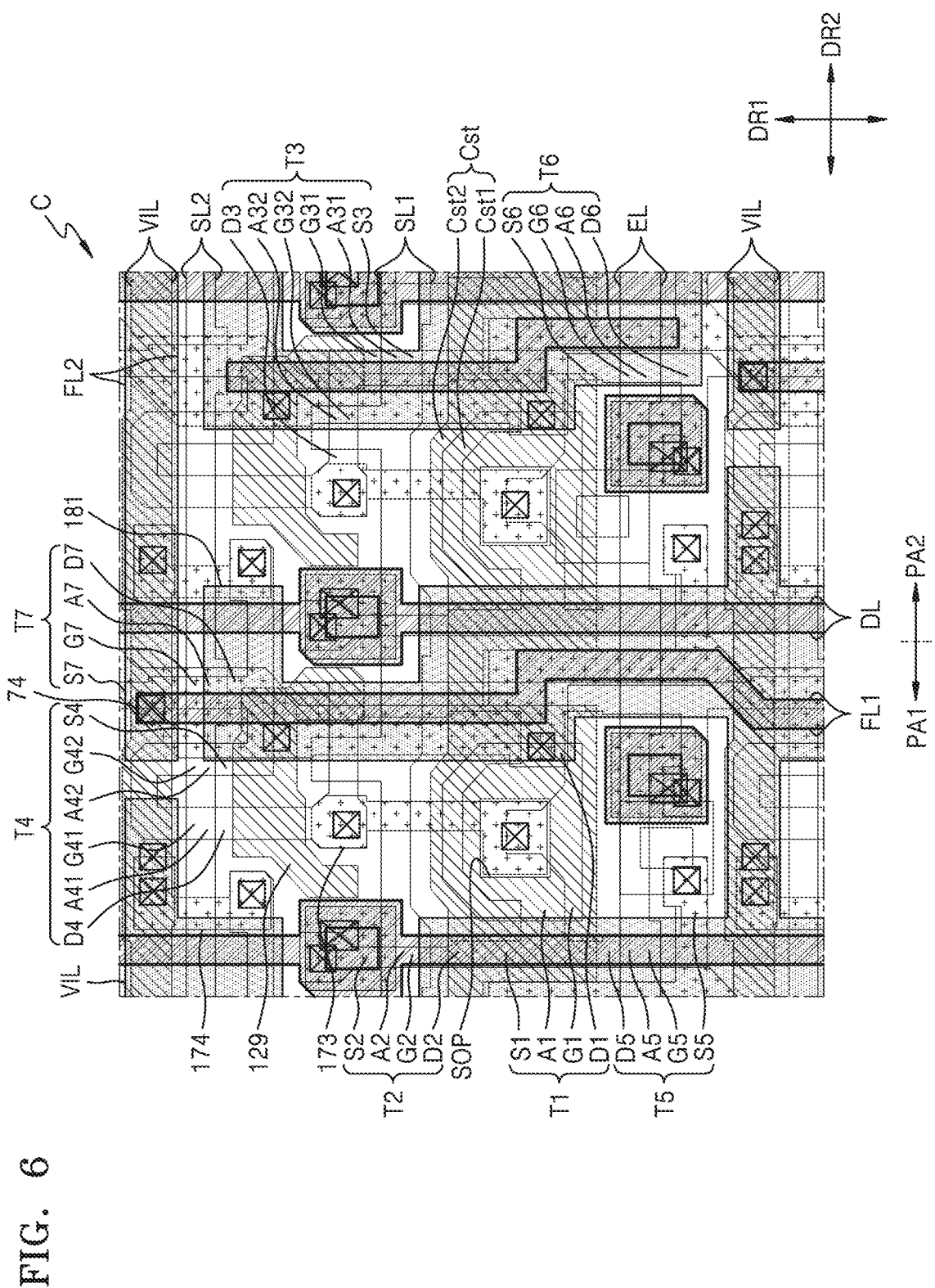
FIG. 6 is an enlarged view of region C of FIG. 5.

The first scan line SL1, the second scan line SL2, the third scan line SL3, the emission control line EL, and the initialization voltage line VIL may extend in the second direction DR2 and may be apart from one another in each row (Refer to FIG. 6). The data line DL and the power supply voltage line PL may extend in the first direction DR1 and may be apart from each other in each column (Refer to FIG. 7).

A pixel circuit PC of the pixel PX may include a plurality of first through seventh transistors T1 through T7 and a capacitor Cst. The first through seventh transistors T1 through T7 may be implemented with thin-film transistors.

The first transistor T1 may be connected to the power supply voltage line PL via the fifth transistor T5 and may be electrically connected to the organic light-emitting diode OLED via the sixth transistor T6. The first transistor T1 functions as a driving transistor, receives the data signal DATA according to a switching operation of the second transistor T2 and supplies a driving current Ioled to the organic light-emitting diode OLED.

The second transistor T2 may be connected to the first scan line SL1 and the data line DL and may be turned on according to a first scan signal GW received via the first scan line SL1 so as to perform a switching operation of transmitting the data signal DATA transmitted to the data line DL to a node N.

The third transistor T3 may be connected to the organic light-emitting diode OLED via the sixth transistor T6. The third transistor T3 may be turned on according to the first scan signal GW received via the first scan line SL1, thereby diode-connecting the first transistor T1.

The fourth transistor T4 may be turned on according to the second scan signal GI received via the second scan line SL2, may transmit the initialization voltage VINT from the initialization voltage line VIL to a gate electrode of the first transistor T1, thereby initializing a gate voltage of the first transistor T1.

The fifth transistor T5 and the sixth transistor T6 may be simultaneously turned on according to an emission control signal EM received via the emission control line EL and may form a current path such that the driving current Ioled may flow from the power supply voltage line PL to the organic light-emitting diode OLED.

The seventh transistor T7 may be turned on according to the third scan signal GB received via the third scan line SL3 and may transmit the initialization voltage VINT from the initialization voltage line VIL to the organic light-emitting diode OLED, thereby initializing the organic light-emitting diode OLED. The seventh transistor T7 may be omitted.

In FIG. 4, the fourth transistor T4 is connected to the second scan line SL2, and the seventh transistor T7 is connected to an additional third scan line SL3. In another exemplary embodiment, the seventh transistor T7 may be connected to the second scan line SL2 together with the fourth transistor T4.

The capacitor Cst may be connected to the power supply voltage line PL and the gate electrode of the first transistor T1 and may store and maintain a voltage corresponding to a difference between both-end voltages, thereby maintaining a voltage applied to the gate electrode of the first transistor T1.

The organic light-emitting diode OLED may include a pixel electrode and an opposite electrode, and a second power supply voltage ELVSS may be applied to the opposite electrode of the organic light-emitting diode OLED. The organic light-emitting diode OLED may receive the driving current Ioled from the first transistor T1 and may emit light, thereby displaying an image.

Figure 5:
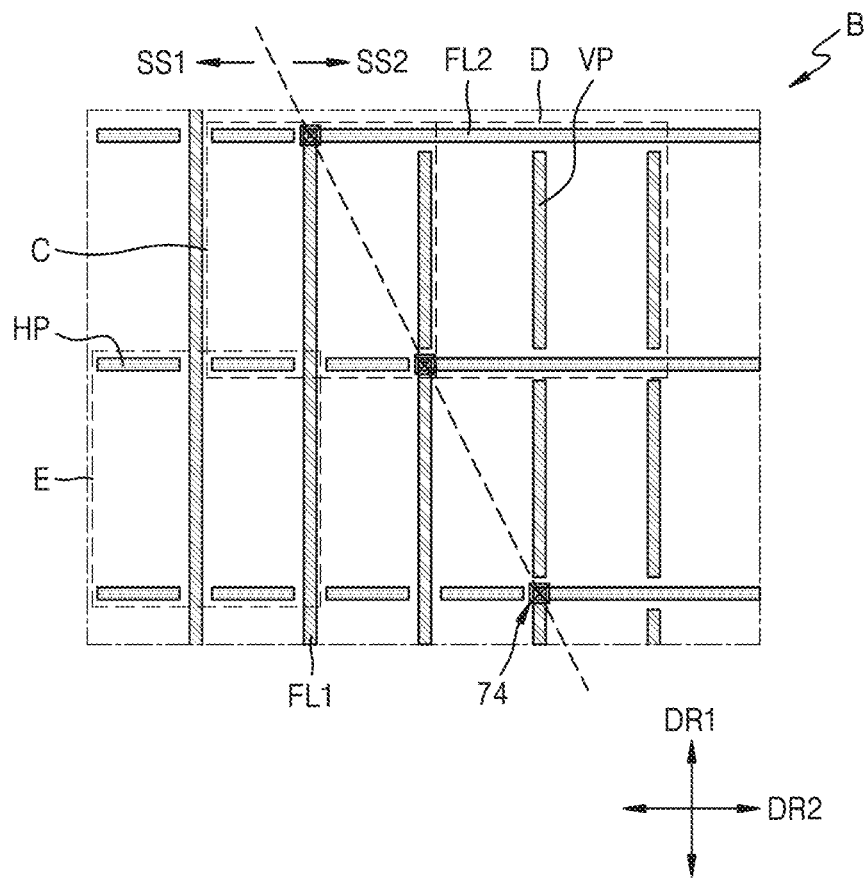
FIG. 5 is an enlarged plan view of a part of region B of FIG. 3 according to an exemplary embodiment.

FIG. 5 is an enlarged plan view of a part of region B of FIG. 3 according to an exemplary embodiment.

Referring to FIG. 5, in the first sub-region SS1, the first portions FL1 of the connection lines FL may extend in a direction parallel to the first direction DR1. In an exemplary embodiment, the first portions FL1 may overlap the power supply voltage line (see PL of FIG. 7) and may be apart from the data line DL so as to be in parallel with the data line (see DL of FIG. 7). Each power supply voltage line PL and the data line DL may be extended in the first direction DR1 and may be apart from each other. The power supply voltage lines PL may be spaced apart by a column distance in the second direction DR2 and the data lines DL may be spaced apart by a column distance in the second direction DR2. In an exemplary embodiment, a width of the power supply voltage line PL in the second direction DR2 may be greater than the width of each of the first portions FL1 and may fully cover the width of each of the first portions FL1. In each row, a horizontal pattern HP having a certain length in the second direction DR2 may be provided between adjacent first portions FL1. The horizontal pattern HP may be located in a virtual straight line extending from the second portions FL2 of the connection lines FL as shown in FIG. 5 and may be arranged in the same layer as the second portions FL2.

In the second sub-region SS2, the second portions FL2 of the connection lines FL may extend in a direction parallel to the second direction DR2. In an exemplary embodiment, the second portions FL2 may overlap the initialization voltage line (see VIL of FIG. 6). In an exemplary embodiment, the width of the initialization voltage line VIL in the first direction DR1 may be greater than the width of each of the second portions FL2 and may fully cover the width the second portions FL2. In each column, a vertical pattern VP having a certain length in the first direction DR1 may be provided between the adjacent second portions FL2. The vertical pattern VP may be located in a virtual straight line extending from the first portions FL1 of the connection lines FL and may be arranged in the same layer as the first portions FL1.

The first portions FL1 and the second portions FL2 of the connection lines FL may be arranged in different layers and may be electrically connected to one another via a contact hole 74. In an exemplary embodiment, the first portions FL1 of the connection lines FL may be arranged in an upper layer of the second portions FL2 and may be electrically connected to each other via the contact hole 74 formed in an insulating layer (insulating layers) between the second portions FL2 and the first portions FL1.

Although not shown, in the third sub-regions SS3, the third portions FL3 of the connection lines CL may extend in a direction parallel to the first direction DR1. The third portions FL3 may overlap the power supply voltage line PL in the same manner as the first portions FL1 and may be apart from the data line DL in parallel with the data line DL. In each row, a horizontal pattern HP having a certain length in the second direction DR2 may be provided between the adjacent third portions FL3. The third portions FL3 of the connection lines FL may be arranged in the same layer as the first portions FL1 and may be electrically connected to the second portions FL2 via a contact hole.

The horizontal patterns HP and the vertical patterns VP may be provided in the first region SR1 such that a region in which the first portions FL1, the second portions FL2 and the third portions FL3 of the connection lines FL are arranged, and a region in which the first portions FL1, the second portions FL2 and the third portions FL3 of the connection lines FL are not arranged, may be prevented from being distinguished from each other and recognized and may provide advantages in a manufacturing process by obtaining a pattern density.

Figure 7:
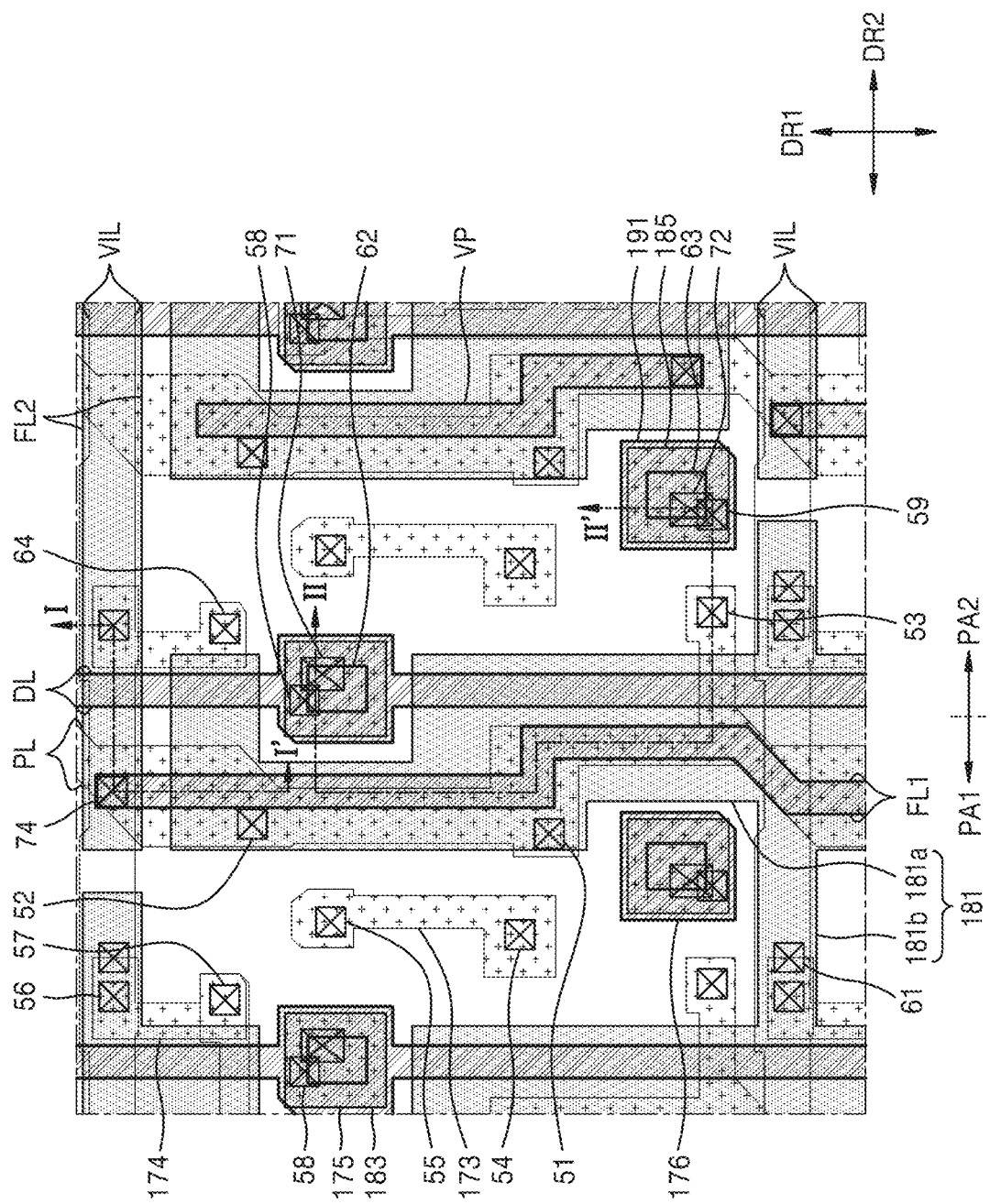
FIG. 7 is a layout diagram showing some lines of FIG. 6.
Figure 8A:
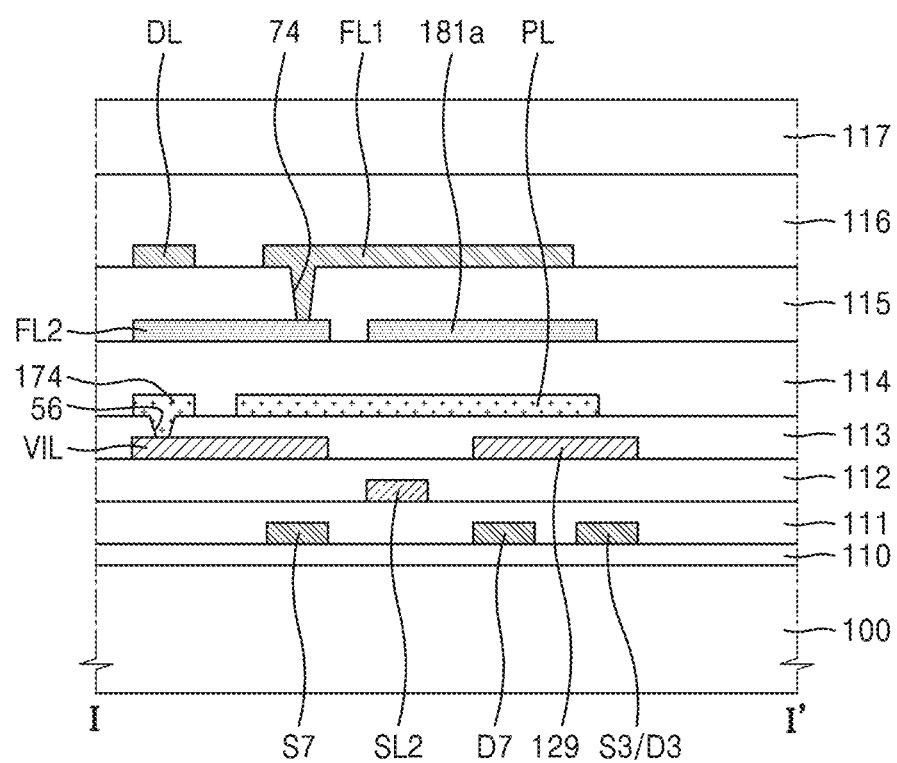
FIG. 8A is a schematic cross-sectional view taken along line I-I' of FIG. 7.
Figure 8B:
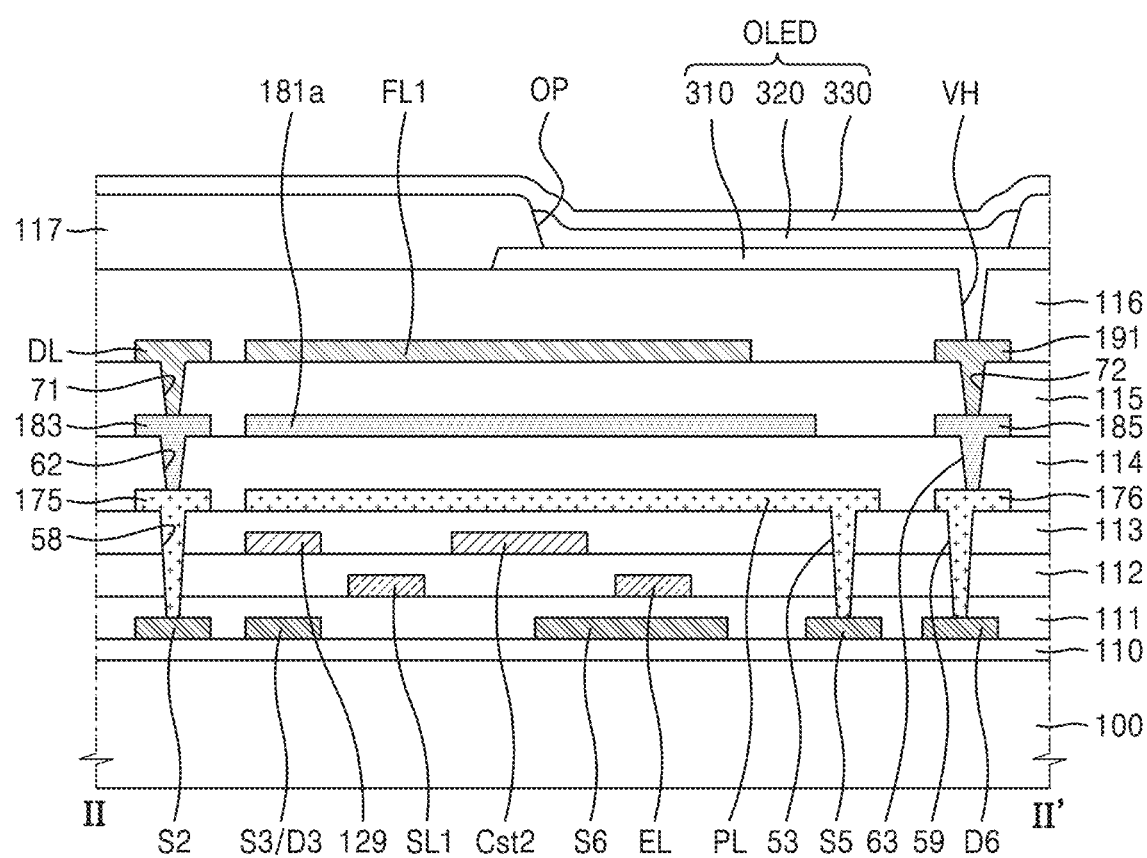
FIG. 8B is a schematic cross-sectional view taken along line II-II' of FIG. 7.

FIG. 6 is a layout diagram schematically illustrating locations of a plurality of thin-film transistors and a capacitor arranged in a pair of adjacent pixel circuits of a display device according to an exemplary embodiment and is an enlarged view of region C of FIG. 5. FIG. 7 is a layout diagram illustrating some lines of FIG. 6. FIG. 8A is a schematic cross-sectional view taken along line I-I' of FIG. 7, and FIG. 8B is a schematic cross-sectional view taken along line II-II' of FIG. 7. FIGS. 8A and 8B are drawn concentrate on the data lines and the connection lines FL, and some elements may be omitted.

Referring to FIGS. 6 through 8B, a display device according to an exemplary embodiment may include a substrate 100, thin-film transistors, a capacitor, the power supply voltage line PL extending in the first direction DR1 within the display area DA, the data line DL apart from the power supply voltage line PL, and the connection lines FL for connecting the data line DL to the pad. Each of the connection lines FL may include a first portion FL1 extending in the first direction DR1 and a second portion FL2 extending in the second direction DR2. In FIGS. 6 and 7, pixel circuits are arranged in each of a left pixel area PA1 in which the organic light-emitting diodes OLED of the left pixels are arranged, and a right pixel area PA2 in which the organic light-emitting diodes OLED of the right pixels are arranged. Hereinafter, a pixel circuit of the right pixel will be described.

The substrate 100 may include various materials, such as a glass material, a metal material, a plastic material, and the like. In an exemplary embodiment, the substrate 100 may be a flexible substrate and may include polymer resin, for example, polyethersulphone ("PES"), polyacrylate, polyetherimide ("PEI"), polyethylenenapthalate ("PEN"), polyethyleneterepthalate ("PET"), polyphenylenesulfide ("PPS"), polyarlylate ("PAR"), polyimide ("PI"), polycarbonate ("PC"), or cellulose acetate propionate ("CAP"), for example. The substrate 100 may have a multi-layer structure including a layer including the polymer resin described above and an inorganic layer (not shown). A buffer layer 110 may be arranged on the substrate 100.

The buffer layer 110 may have a single layer or multi-layer structure including an inorganic insulating material, such as silicon oxide, silicon nitride, or silicon oxynitride. A barrier layer (not shown) for preventing penetration of external air may be further included between the substrate 100 and the buffer layer 110. In another exemplary embodiment, the buffer layer 110 may also be omitted.

A semiconductor layer may be located on the buffer layer 110. The semiconductor layer may include amorphous silicon, polycrystalline silicon, or an organic semiconductor material. The semiconductor layer may have various shapes including a curved shape. As shown in FIG. 6, the semiconductor layer may include a channel area A1 of the first transistor T1, a channel area A2 of the second transistor T2, channel areas A31 and A32 of the third transistor T3, channel areas A41 and A42 of the fourth transistor T4, a channel area A5 of the fifth transistor T5, a channel area A6 of the sixth transistor T6, and a channel area A7 of the seventh transistor T7. That is, channel areas of the first through seventh transistors T1 through T7 may be some areas of the semiconductor layer. The channel area A1 of the first transistor T1 may have a curve and may be long such that a driving range of the gate voltage applied to the gate electrode of the first transistor T1 may be wide. The shape of the channel area A1 of the first transistor T1 may include shapes such as '⊏', '⊒', 'S', 'M', and 'W' according to various exemplary embodiments. The channel area A7 of the seventh transistor T7 may be some areas of the semiconductor layer extending from the previous row.

The semiconductor layer of each of the first through seventh transistors T1 though T7 may include a source area and a drain area at both sides of the channel area. The semiconductor layer may include a source area S1 and a drain area D1 of the first transistor T1, a source area S2 and a drain area D2 of the second transistor T2, a source area S3 and a drain area D3 of the third transistor T3, a source area S4 and a drain area D4 of the fourth transistor T4, a source area S5 and a drain area D5 of the fifth transistor T5, a source area S6 and a drain area D6 of the sixth transistor T6, and a source area S7 and a drain area D7 of the seventh transistor T7. The source area or drain area may correspond to a source electrode or drain electrode of the transistor. In another exemplary embodiment, locations of the source area and the drain area may be changed. A first insulating layer 111 may be located above the semiconductor layer.

A gate electrode G1 of the first transistor T1, a gate electrode G2 of the second transistor T2, gate electrodes G31 and G32 of the third transistor T3, gate electrodes G41 and G42 of the fourth transistor T4, a gate electrode G5 of the fifth transistor T5, a gate electrode G6 of the sixth transistor T6, and a gate electrode G7 of the seventh transistor T7 may be arranged on the first insulating layer 111. Also, the first scan line SL1, the second scan line SL2, the third scan line SL3, and the emission control line EL may extend in the second direction DR2, may be arranged on the first insulating layer 111 and in the same layer as the gate electrodes G1 through G7 of the first through seventh transistors T1 through T7, and may include or be formed of the same materials as materials for forming the gate electrodes G1 through G7 of the first through seventh transistors T1 through T7. The gate electrode G1 of the first transistor T1 may function as a lower electrode Cst1 of the capacitor Cst.

The gate electrode G2 of the second transistor T2 and the gate electrodes G31 and G32 of the third transistor T3 may be portions of the first scan line SL1 or portions protruding from the first scan line SL1 crossing the semiconductor layer. The gate electrodes G41 and G42 of the fourth transistor T4 and the gate electrode G7 of the seventh transistor T7 may be portions of the second scan line SL2 or portions protruding from the second scan line SL2 crossing the semiconductor layer. The gate electrode G5 of the fifth transistor T5 and the gate electrode G6 of the sixth transistor T6 may be portions of the emission control line EL or portions protruding from the emission control line EL crossing the semiconductor layer. The gate electrode G1 of the first transistor T1 may be of an island type.

The gate electrodes of the first through seventh transistors T1 through T7 may have a single layer or multi-layer structure including one or more materials of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu), for example. A second insulating layer 112 may be located on the gate electrodes G1 through G7 of the first through seventh transistors T1 through T7.

An upper electrode Cst2 of the capacitor Cst may be located on the second insulating layer 112. An opening SOP may be formed in the upper electrode Cst2 of the capacitor Cst. The lower electrode Cst1 of the capacitor Cst and the drain area D3 of the third transistor T3 may be electrically connected to a node electrode 173 through the opening SOP. The upper electrode Cst2 of the capacitor Cst may have a single layer or multi-layer structure including one or more materials of Al, Pt, Pd, Ag, Mg, Au, Ni, Nd, Ir, Cr, Li, Ca, Mo, Ti, W, and Cu, for example. The capacitor Cst may share the gate electrode G1 of the first transistor T1 as the lower electrode Cst1 and may overlap the first transistor T1 in a plan view.

The initialization voltage line VIL and a shielding electrode 129 may be arranged on the second insulating layer 112 together with the upper electrode Cst2 of the capacitor Cst. The initialization voltage line VIL and the shielding electrode 129 may include the same material for forming the upper electrode Cst2 of the capacitor Cst. The initialization voltage line VIL may extend in the second direction D2. The shielding electrode 129 may overlap a region between two channel areas A31 and A32 of the third transistor T3, a drain area D3 of the third transistor T3 and a drain area D4 of the fourth transistor T4, a source area S4 of the fourth transistor T4, and a drain area D7 of the seventh transistor T7.

A third insulating layer 113 may be located on the upper electrode Cst2 of the capacitor Cst, the initialization voltage line VIL and the shielding electrode 129.

The first insulating layer 111, the second insulating layer 112, and the third insulating layer 113 may include an inorganic insulating layer including an inorganic material, such as silicon oxide, silicon nitride and/or silicon oxynitride.

As shown in FIGS. 7, 8A and 8B, the power supply voltage line PL extending in the first direction DR1, the node electrode 173, and connection electrodes 174, 175, and 176 may be arranged on the third insulating layer 113.

The power supply voltage line PL may be connected to the upper electrode Cst2 of the capacitor Cst via a contact hole 51 defined in the third insulating layer 113. The power supply voltage line PL may be connected to the shielding electrode 129 via a contact hole 52 defined in the third insulating layer 113. The power supply voltage line PL may be connected to the source area S5 of the fifth transistor T5 via a contact hole 53 defined in the first insulating layer 111, the second insulating layer 112, and the third insulating layer 113. The power supply voltage line PL may be located in a pixel area to which part of the power supply voltage line PL is adjacent. In FIG. 7, the power supply voltage line PL for the right pixel is located in the left pixel area PA1, and a portion protruding from the power supply voltage line PL toward the right pixel area PA2 is in contact with the semiconductor layer of the fifth transistor T5.

A first end of the node electrode 173 may be connected to the gate electrode G1 of the first transistor T1 via a contact hole 54 defined in the second insulating layer 112 and the third insulating layer 113, and a second end of the node electrode 173 may be connected to one ends of the semiconductor layers of the third transistor T3 and the fourth transistor T4. For example, the second end of the node electrode 173 may be connected to the drain area D3 of the third transistor T3 and the drain area D4 of the fourth transistor T4 via a contact hole 55 defined in the first insulating layer 111, the second insulating layer 112, and the third insulating layer 113. In this case, the first end of the node electrode 173 may be connected to the gate electrode G1 of the first transistor T1 via the opening SOP defined by the upper electrode Cst2 of the capacitor Cst.

A first end of the connection electrode 174 may be connected to the initialization voltage line VIL via a contact hole 56 defined in the third insulating layer 113, and a second end of the connection electrode 174 may be connected to the source area S4 of the fourth transistor T4 and the drain area D7 of the seventh transistor T7 via a contact hole 57 defined in the first insulating layer 111, the second insulating layer 112, and the third insulating layer 113. The connection electrode 175 may be connected to the source area S2 of the second transistor T2 via a contact hole 58 defined in the first insulating layer 111, the second insulating layer 112, and the third insulating layer 113. The connection electrode 176 may be connected to a drain area D6 of the sixth transistor T6 via a contact hole 59 defined in the first insulating layer 111, the second insulating layer 112, and the third insulating layer 113.

The power supply voltage line PL, the node electrode 173, and the connection electrodes 174, 175, and 176 may include Mo, Al, Cu, and/or T and may have a multi-layer or single layer structure. In an exemplary embodiment, the power supply voltage line PL, the node electrode 173, and the connection electrodes 174, 175, and 176 may have a multi-layer structure of Ti/Al/Ti.

A fourth insulating layer 114 may be located on the power supply voltage line PL and be a planarization layer. The second portions FL2 of the connection lines FL, the conductive layer 181, and the connection electrodes 183 and 185 may be arranged on the fourth insulating layer 114.

The second portions FL2 of the connection lines FL may extend in the second direction DR2. The second portions FL2 of the connection lines FL may overlap the initialization voltage line VIL. The width of each of the second portions FL2 of the connection lines FL in the first direction DR1 may be the same as or different from the width of the initialization voltage line VIL. In an exemplary embodiment, as shown in FIG. 7, the width of each of the second portions FL2 of the connection lines FL may be equal to or greater than the width of the initialization voltage line VIL and may cover the entire width of the initialization voltage line VIL. In another exemplary embodiment, the width of each of the second portions FL2 of the connection lines FL may be less than the width of the initialization voltage line VIL.

The conductive layer 181 may be arranged in the same layer as the second portions FL2 of the connection lines FL and may be apart from the second portions FL2 of the connection lines FL. Part of the conductive layer 181 may be arranged in the left pixel area PA1, and the other part of the conductive layer 181 may be arranged in the right pixel area PA2. The conductive layer 181 may include a first portion 181a that extends in the first direction DR1 and overlaps the power supply voltage line PL in the left pixel area PA1. The conductive layer 181 may further include a second portion 181b that overlaps the initialization voltage line VIL, protrudes from the first portion 181a towards the second direction DR2, and is arranged in the left pixel area PA1 and the right pixel area PA2. The second portion 181b of the conductive layer 181 may be connected to the connection electrode 174 via a contact hole 61 defined in the fourth insulating layer 114 and may be electrically connected to the initialization voltage line VIL. The width of the second portion 181b of the conductive layer 181 in the first direction DR1 may be the same as the width of the second portions FL2 of the connection lines FL. In another exemplary embodiment, the width of the second portion 181b of the conductive layer 181 may be different from the width of each of the second portions FL2 of the connection lines FL. The second portion 181b of the conductive layer 181 and the second portions FL2 of the connection lines FL arranged in the same line in a plan view may be apart from each other.

The connection electrode 183 may overlap the connection electrode 175 in a plan view, may be connected to the connection electrode 175 via a contact hole 62 defined in the fourth insulating layer 114, and thus may be connected to the source area S2 of the second transistor T2. The connection electrode 185 may overlap the connection electrode 176 in a plan view, may be connected to the connection electrode 176 via a contact hole 63 defined in the fourth insulating layer 114, and thus may be connected to the drain area D6 of the sixth transistor T6.

The second portions FL2 of the connection lines FL, the conductive layer 181, and the connection electrodes 183 and 185 may include Mo, Al, Cu, and/or Ti, and may have a multi-layer or single layer structure. In an exemplary embodiment, the second portions FL2 of the connection lines FL, the conductive layer 181, and the connection electrodes 183 and 185 may have a multi-layer structure of Ti/Al/Ti.

A fifth insulating layer 115 may be arranged on the second portions FL2 of the connection lines FL, the conductive layer 181, and the connection electrodes 183 and 185, and be a planarization layer. The data line DL and the first portions FL1 of the connection lines FL may be arranged on the fifth insulating layer 115. A connection electrode 191 may be further located on the fifth insulating layer 115.

The data line DL may be a first data line DL1. The data line DL may extend in the first direction DR1, and part of the data line DL may overlap the conductive layer 181. The data line DL may be connected to the connection electrode 183 via a contact hole 71 defined in the fifth insulating layer 115 and thus may be connected to the source area S2 of the second transistor T2.

The first portions FL1 of the connection lines FL may be apart from the data line DL and may extend in the first direction DR1. Part of the first portions FL1 of the connection lines FL may be overlap the conductive layer 181 and the power supply voltage line PL. The first portions FL1 of the connection lines FL may be connected to the second portions FL2 at a border between the first sub-region SS1 and the second sub-region SS2 or near the border. The first portions FL1 of the connection lines FL may be electrically connected to the second portions FL2 via the contact hole 74 defined in the fifth insulating layer 115. The width of each of the first portions FL1 of the connection lines FL in the direction DR2 may be less than the width of the conductive layer 181 and/or the width of the power supply voltage line PL. The width of each of the first portions FL1 of the connection lines FL in the second direction DR2 may be the same as or different from the width of each of the second portions FL2 of the connection lines FL in the first direction DR1. In FIG. 7, the width of each of the first portions FL1 of the connection lines FL is less than the width of each of the second portions FL2 of the connection lines FL. However, in another exemplary embodiment, the width of each of the first portions FL1 of the connection lines FL may be equal to or greater than the width of each of the second portions FL2 of the connection lines FL.

The connection electrode 191 may overlap the connection electrode 185 in the plan view, may be connected to the connection electrode 185 via the contact hole 72 defined in the fifth insulating layer 115, and thus may be connected to the drain area D6 of the sixth transistor T6.

In an exemplary embodiment of the present disclosure, the conductive layer 181 may be a shielding layer that is arranged on a layer between the power supply voltage line PL and the data line DL and minimizes electrical signal interference, such as coupling between the power supply voltage line PL and the data line DL.

The data line DL and the first portions FL1 of the connection lines FL may include Mo, Al, Cu, and/or Ti and may have a multi-layer or single layer structure. In an exemplary embodiment, the data line DL and the first portions FL1 of the connection lines FL may have a multi-layer structure of Ti/Al/Ti. A sixth insulating layer 116 may be located on the data line DL and the first portions FL1 of the connection lines FL.

The fourth insulating layer 114, the fifth insulating layer 115, and the sixth insulating layer 116 may be a planarization layer and an organic insulating layer. The fourth through sixth insulating layers 114 through 116 may include an organic insulating material, such as general-purpose polymer, such as polymethyl methacrylate ("PMMA") or polystyrene ("PS"), a polymer derivative having a phenol-based group, acryl-based polymer, imide-based polymer, aryl ether-based polymer, amide-based polymer, fluorine-based polymer, p-xylene-based polymer, vinyl alcohol-based polymer, or a blend thereof, for example. In an exemplary embodiment, the fourth through sixth insulating layers 114 through 116 may include polyimide.

The organic light-emitting diode OLED may be arranged on the sixth insulating layer 116, as a display element. The organic light-emitting diode OLED may include a pixel electrode 310, an intermediate layer 320, and an opposite electrode 330.

The pixel electrode 310 may be located on the sixth insulating layer 116 and may include conductive oxide, such as indium tin oxide ("ITO"), indium zinc oxide ("IZO"), zinc oxide (ZnO), indium oxide ($In_2O_3$), indium gallium oxide ("IGO"), or aluminum zinc oxide ("AZO"), for example. In another exemplary embodiment, the pixel electrode 310 may include a reflective layer including Ag, Mg, Al, Pt, Pd, Au, Ni, Nd, Ir, Cr, or a compound thereof, for example. In another exemplary embodiment, the pixel electrode 310 may further include a layer formed of ITO, IZO, ZnO, or $In_2O_3$ on/under the reflective layer described above. The pixel electrode 310 may be electrically connected to the connection electrode 191 on the fifth insulating layer 115 via a contact hole VH defined in the sixth insulating layer 116. Thus, the pixel electrode 310 may be electrically connected to the sixth transistor T6. In another exemplary embodiment, the connection electrode 191 may be omitted, and the pixel electrode 310 may be electrically connected to the connection electrode 185 on the fourth insulating layer 114 via a contact hole defined in the fifth insulating layer 115 and the sixth insulating layer 116.

A seventh insulating layer 117 may be located on the sixth insulating layer 116. The seventh insulating layer 117 may define an opening corresponding to each pixel, i.e., the opening OP for exposing part of the pixel electrode 310, thereby functioning as a pixel-defining layer. The seventh insulating layer 117 may include an organic material, such as benzocyclobutene ("BOB"), polyimide, or hexamethyldisiloxane ("HMDSO"), for example. Alternatively, the seventh insulating layer 117 may include the inorganic material described above. Hereinafter, the opening OP defined by the seventh insulating layer 117 or a region exposed by the opening OP defined in the seventh insulating layer 117 in the pixel electrode 310 may be defined as an emission region.

The intermediate layer 320 may be located on the pixel electrode 310 exposed by the opening OP of the seventh insulating layer 117. The intermediate layer 320 of the organic light-emitting diode OLED may include a small molecular weight or polymer material. When the intermediate layer 320 of the organic light-emitting diode OLED includes a small molecular weight material, the intermediate layer 320 may have a structure in which a hole injection layer ("HIL"), a hole transport layer ("HTL"), an emission layer ("EML"), an electron transport layer ("ETL") and an electron injection layer ("EIL") are stacked in a single or composite structure, and may include various organic materials including copper phthalocyanine ("CuPc"), N,N'-Di (naphthalene-1-yl)-N,N'-diphenyl-benzidine: NPB), and tris-8-hydroxyquinoline aluminum)("Alq3"), for example. These layers may be formed by using a method such as vacuum deposition.

When the intermediate layer 320 includes a polymer material, the intermediate layer 320 may have a structure usually including an HTL and an EML. In this case, the HTL may include PEDOT, and the EML may include a polyphenylenevinylene ("PPV")-based polymer material and a polyfluorene-based polymer material. The intermediate layer 320 may be formed by screen printing, inkjet printing, or laser induced thermal imaging ("LITI").

The intermediate layer 320 according to the invention is not limited thereto and may have various structures, in another exemplary embodiment. The intermediate layer 320 may include a layer integrally formed over a plurality of pixel electrodes 310 or a layer patterned to correspond to each of the plurality of pixel electrodes 310.

The opposite electrode 330 may be integrally formed to cover a plurality of organic light-emitting diodes and may correspond to the plurality of pixel electrodes 310.

Because the organic light-emitting diode OLED may be easily damaged by moisture or oxygen from the outside, a thin-film encapsulation layer (not shown) or a sealing substrate (not shown) may be located on the organic light-emitting diode OLED and may cover and protect the organic light-emitting diode OLED. The thin-film encapsulation layer (not shown) may cover the display area DA and may extend to the outside of the display area DA. The thin-film encapsulation layer may include at least one inorganic encapsulation layer including an inorganic material and at least one organic encapsulation layer including an organic material. In some exemplary embodiments, the thin-film encapsulation layer may have a structure in which a first inorganic encapsulation layer/an organic encapsulation layer/a second inorganic encapsulation layer are stacked. The sealing substrate (not shown) may face the substrate 100 and may be bonded to the substrate 100 by using a sealing member, such as a sealant or frit, in the non-display area (see NDA of FIG. 1).

Also, a spacer (not shown) for preventing mask stabbing may be further provided on the seventh insulating layer 117, and a variety of functional layers, such as a polarization layer for reducing external light reflection, a black matrix, a color filter, and/or a touch screen layer including a touch electrode, may be provided on the thin-film encapsulation layer in another exemplary embodiment.

Figure 9:
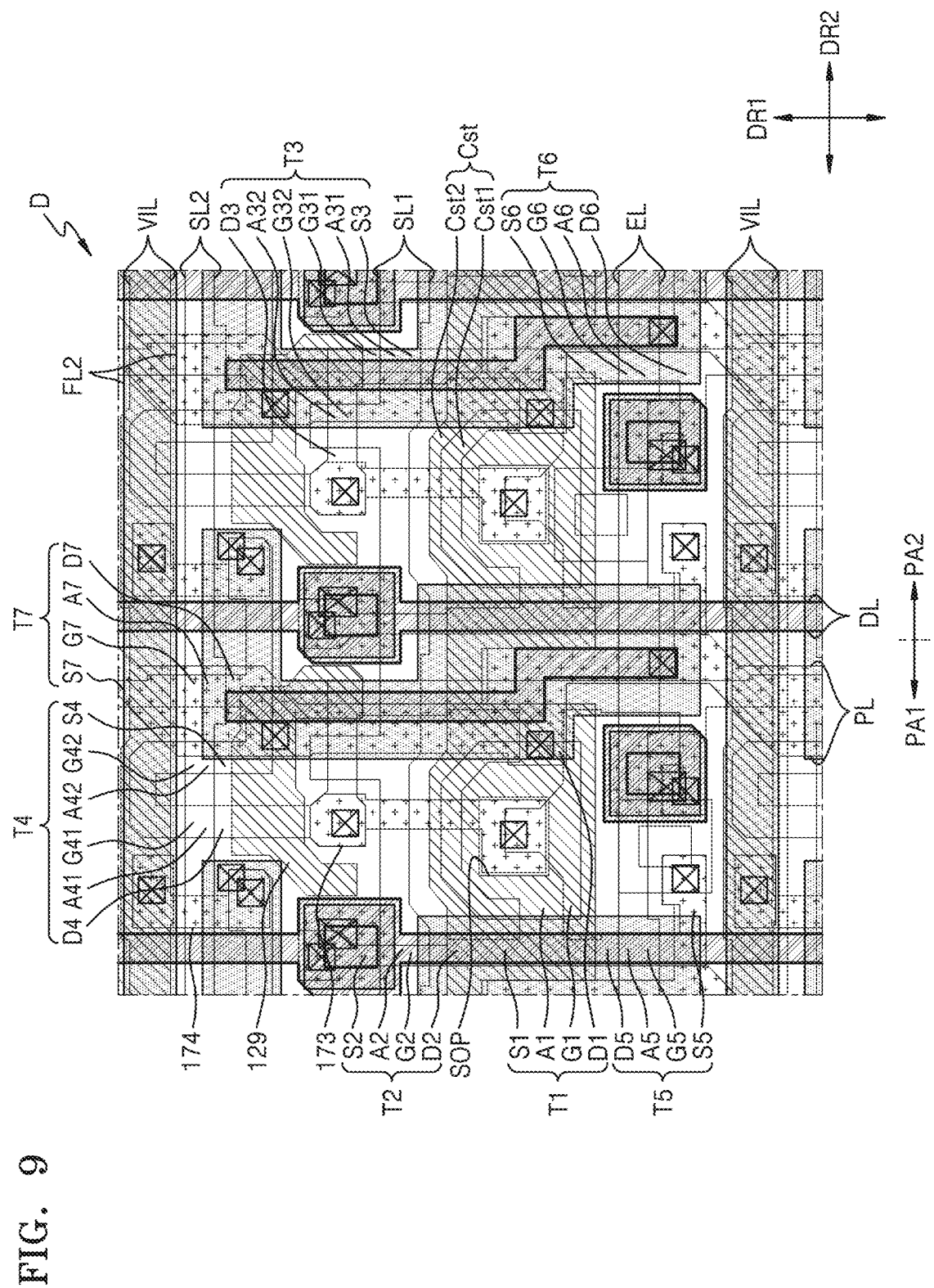
FIG. 9 is an enlarged view of region D of FIG. 5.
Figure 10:
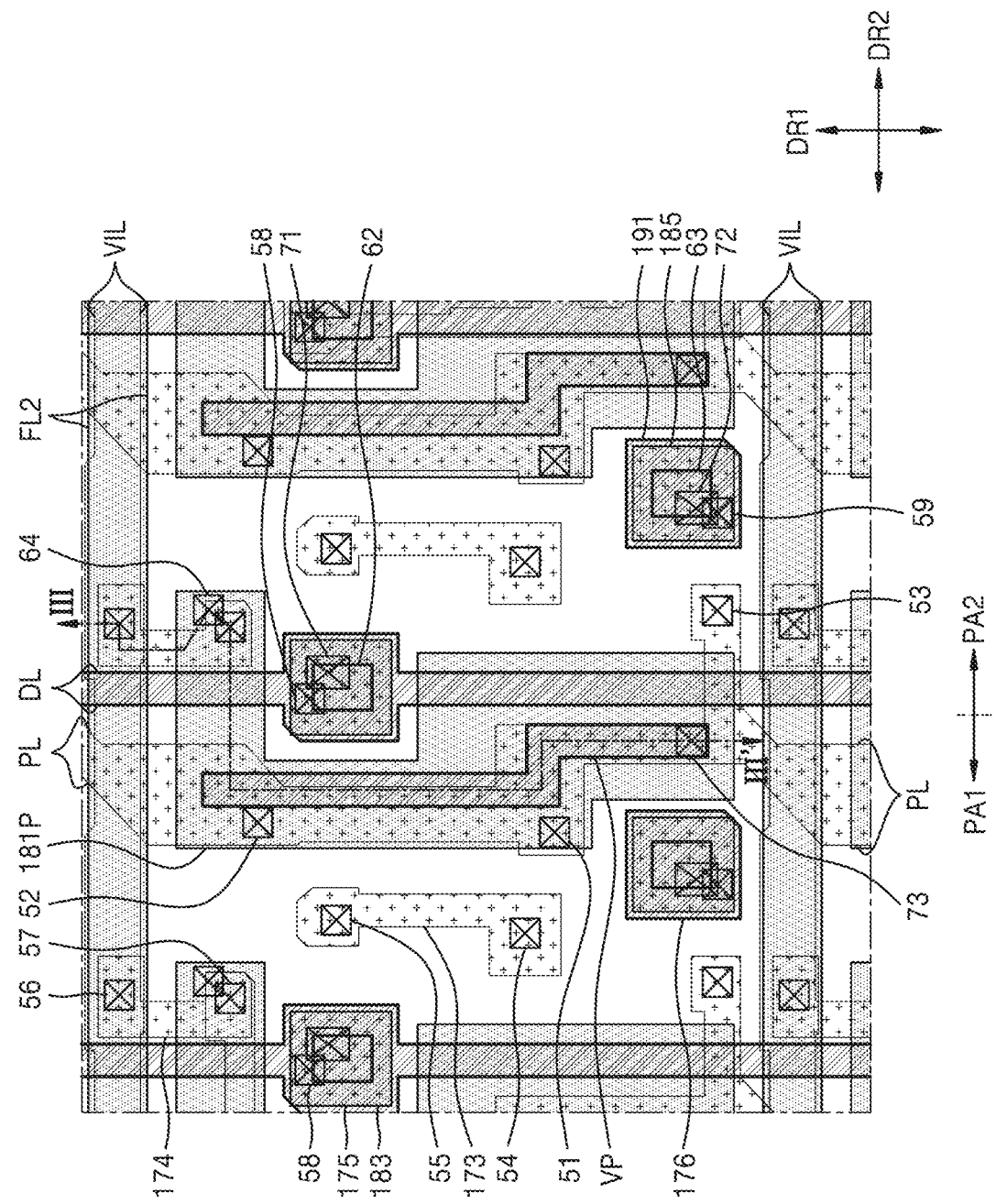
FIG. 10 is a layout diagram showing some lines of FIG. 9.
Figure 11:
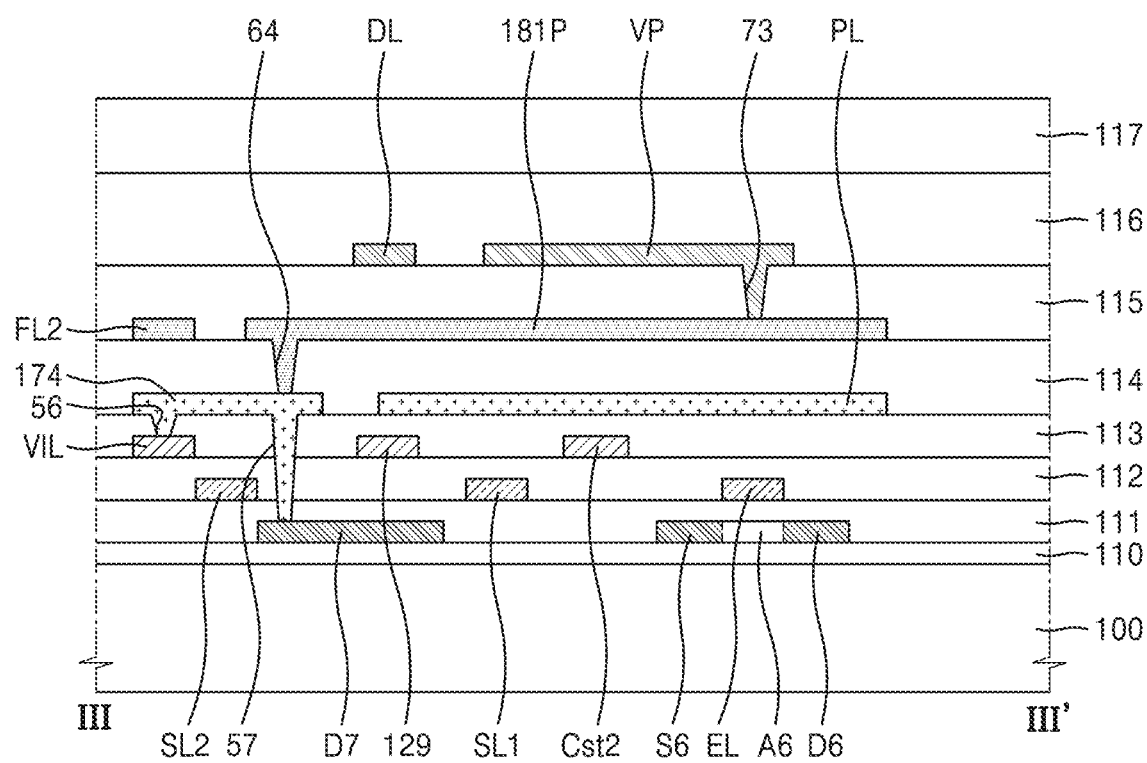
FIG. 11 is a schematic cross-sectional view taken along line III-III' of FIG. 10.

FIG. 9 is an enlarged view of region D of FIG. 5. FIG. 10 is a layout diagram showing some lines of FIG. 9. FIG. 11 is a schematic cross-sectional view taken along line III-III' of FIG. 10. In FIG. 9, the same reference numerals as those of FIG. 6 represent the same elements and thus, a repeated description thereof will be omitted. FIGS. 9 through 11 illustrate second portions FL2 of a pair of adjacent connection lines FL.

Referring to FIGS. 9 through 11, in the second sub-region SS2, a conductive pattern 181P may be located between a pair of the second portions FL2 which are adjacent to each other on a plane. The conductive pattern 181P may be located on the fourth insulating layer 114 and may be located in the same layer as the second portions FL2 of the connection lines FL and the conductive layer 181.

The conductive pattern 181P may extend in the first direction DR1, and part of the conductive pattern 181P may overlap the power supply voltage line PL in a plan view. The conductive pattern 181P may be apart from the adjacent second portions FL2. Part of the conductive pattern 181P may overlap the second end of the connection electrode 174 and may be electrically connected to the second end of the connection electrode 174 via a contact hole 64 defined in the fourth insulating layer 114. Thus, the initialization voltage VINT may be applied to the conductive pattern 181P from the initialization voltage line VIL.

The conductive pattern 181P may include the same material as the conductive layer 181. The conductive pattern 181P may include Mo, Al, Cu, and/or Ti, for example, and may have a multi-layer or single layer structure. In an exemplary embodiment, the conductive pattern 181P may have a multi-layer structure of Ti/Al/Ti.

The fifth insulating layer 115 may be located on the conductive pattern 181P. The vertical pattern VP may be located on the fifth insulating layer 115. The vertical pattern VP may be apart from the data line DL and may extend in the first direction DR1. The vertical pattern VP may overlap the conductive pattern 181P and the power supply voltage line PL in a plan view. The vertical pattern VP may be electrically connected to the conductive pattern 181P via a contact hole 73 defined in the fifth insulating layer 115. Thus, the initialization voltage VINT may be applied to the vertical pattern VP from the initialization voltage line VIL.

In the exemplary embodiment of the present disclosure, similar to the conductive layer 181, the conductive pattern 181P may be a shielding layer that is located on a layer between the power supply voltage line PL and the data line DL and minimizes electrical signal interference between the power supply voltage line PL and the data line DL.

Figure 12:
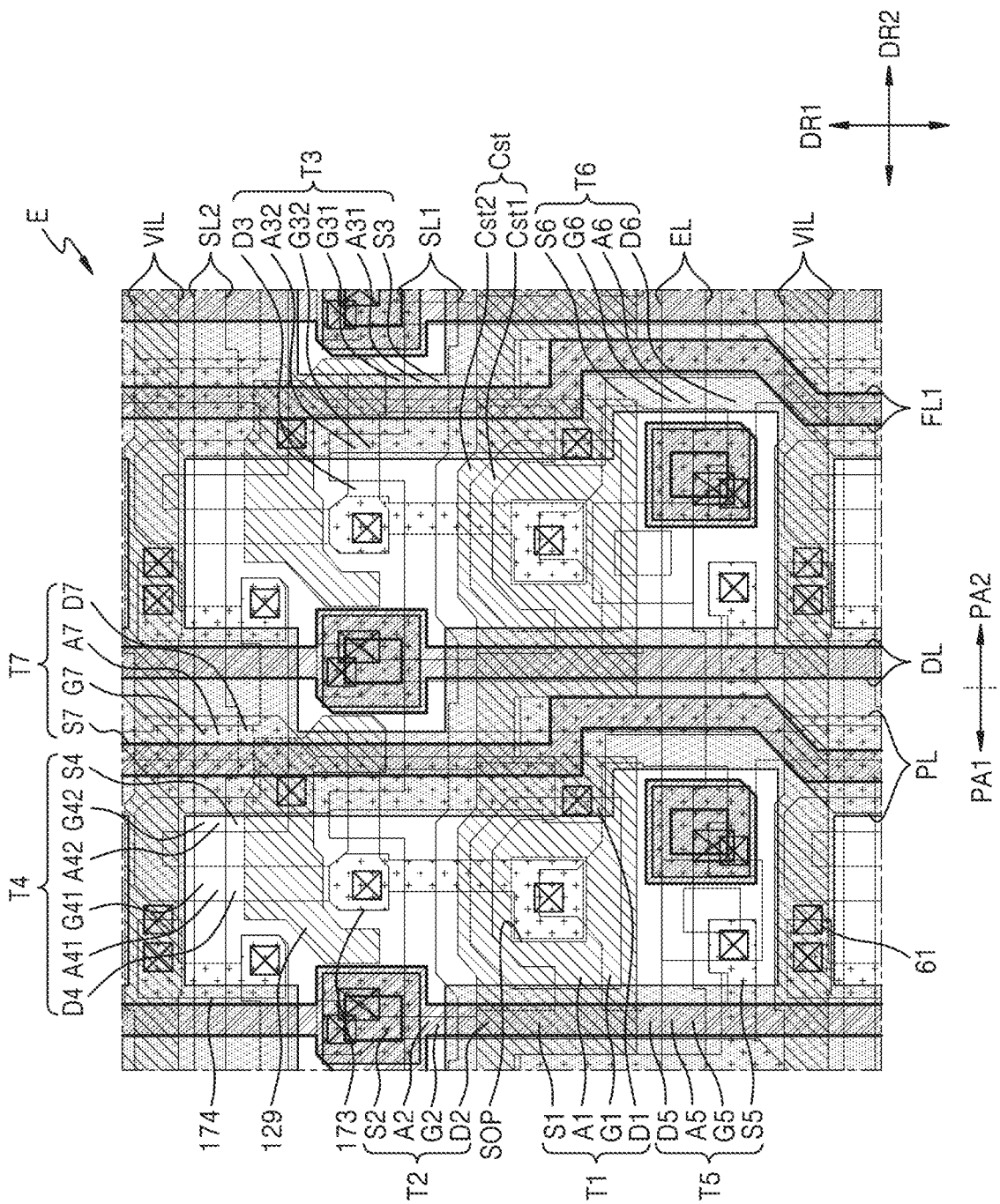
FIG. 12 is an enlarged view of region E of FIG. 5.
Figure 13:
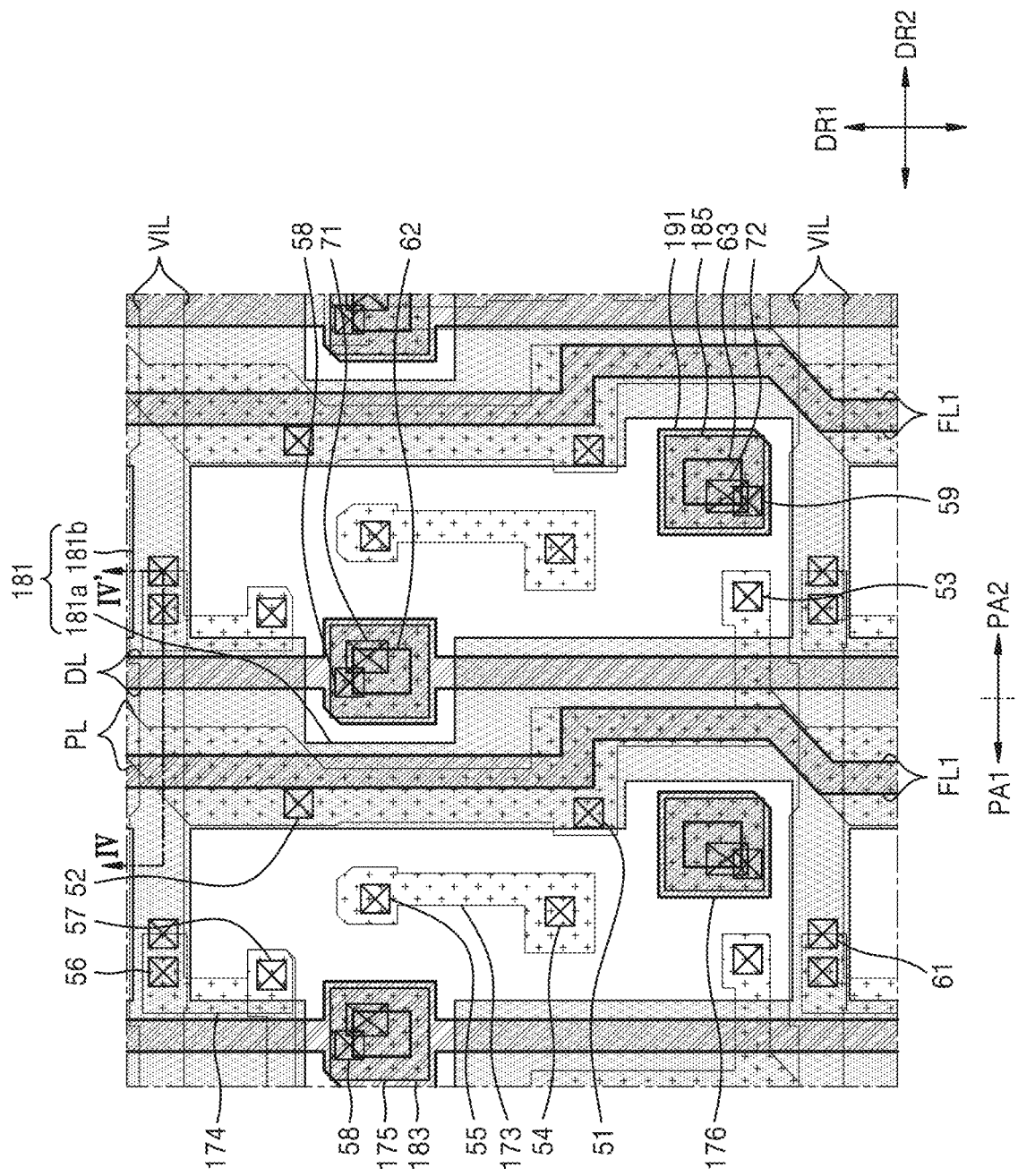
FIG. 13 is a layout diagram showing some lines of FIG. 12.
Figure 14:
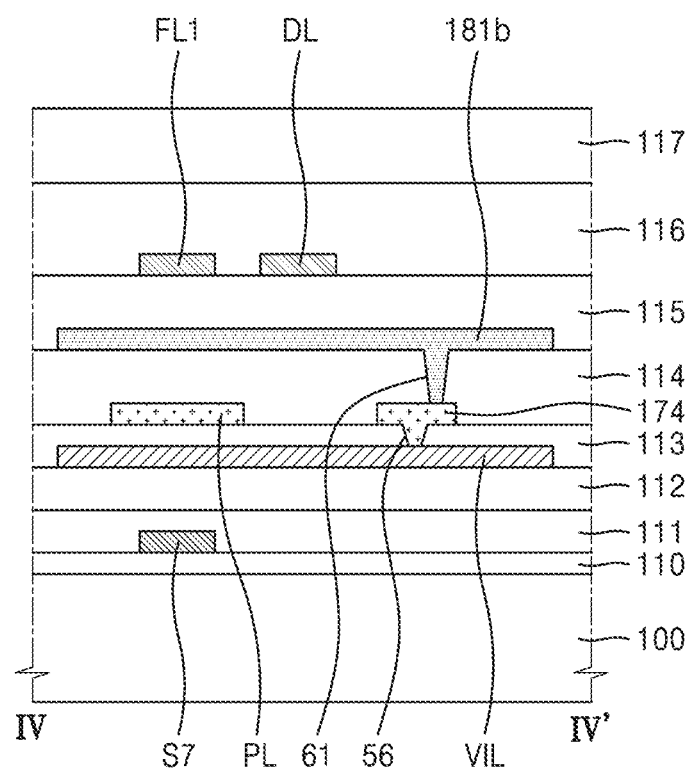
FIG. 14 is a schematic cross-sectional view taken along line IV-IV' of FIG. 13.

FIG. 12 is an enlarged view of region E of FIG. 5. FIG. 13 is a layout diagram showing some lines of FIG. 12. FIG. 14 is a schematic cross-sectional view taken along line IV-IV' of FIG. 13. In FIG. 12, the same reference numerals as those of FIG. 6 represent the same elements and thus, a repeated description thereof will be omitted. FIGS. 12 through 14 illustrate a pair of adjacent first portions FL1.

Referring to FIGS. 12 through 14, in the first sub-region SS1, the first portion 181a and the second portion 181b of the conductive layer 181 may be connected to each other by the plurality of pixels PX and may have a mesh structure. The second portion 181b of the conductive layer 181 may be connected to the connection electrode 174 via the contact hole 61 defined in the fourth insulating layer 114 and thus may be electrically connected to the initialization voltage line VIL. The conductive layer 181 may be connected to the initialization voltage line VIL such that the initialization voltage line VIL may have a dual line structure and a mesh structure in the first sub-region SS1. The second portion 181b of the conductive layer 181 may function as the horizontal pattern (see HP of FIG. 5) in the first sub-region SS1. The fifth insulating layer 115 may be located on the conductive layer 181, and the first portions FL1 of the connection lines and the data line DL may be located on the fifth insulating layer 115.

Figure 15:
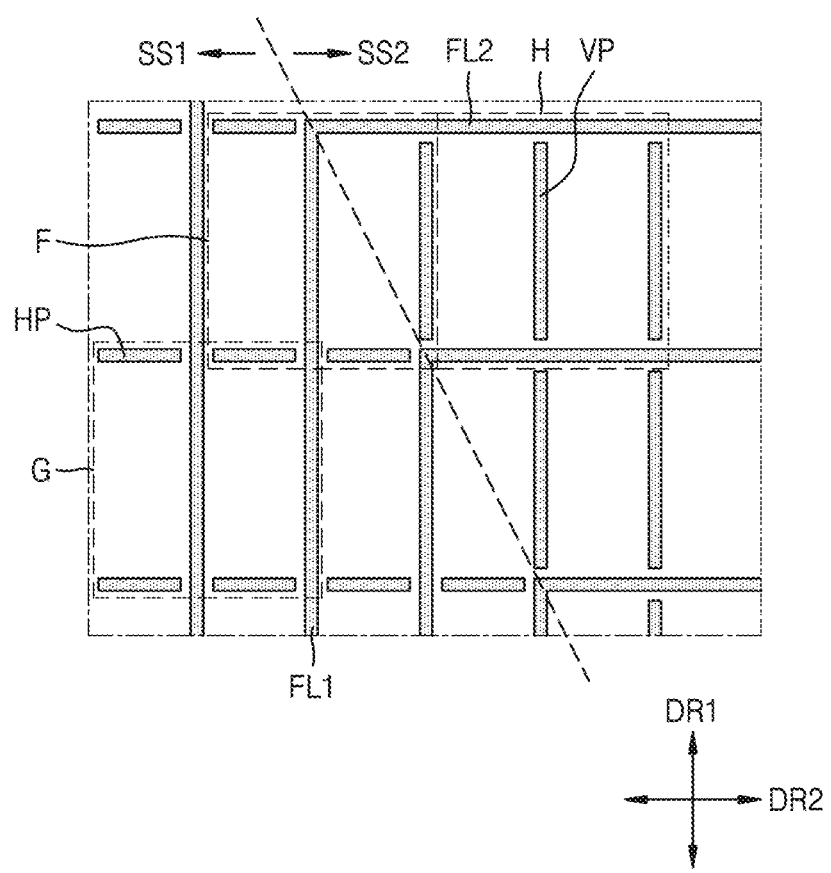
FIG. 15 is a partially-enlarged plan view of region B of FIG. 3 according to another exemplary embodiment.

FIG. 15 is a partially-enlarged plan view of region B of FIG. 3 according to another exemplary embodiment.

The exemplary embodiment of FIG. 15 is different from the exemplary embodiment of FIG. 5 in that the first portions FL1 and the second portions FL2 of the connection lines are integrally formed and are arranged in the same layer. The other configuration thereof is the same and thus, a detailed description thereof will be omitted. Although not shown, the third portions FL3 of the connection lines may be integrally formed with the first portions FL1 and the second portions FL2 and may be arranged on the same layer.

Figure 16:
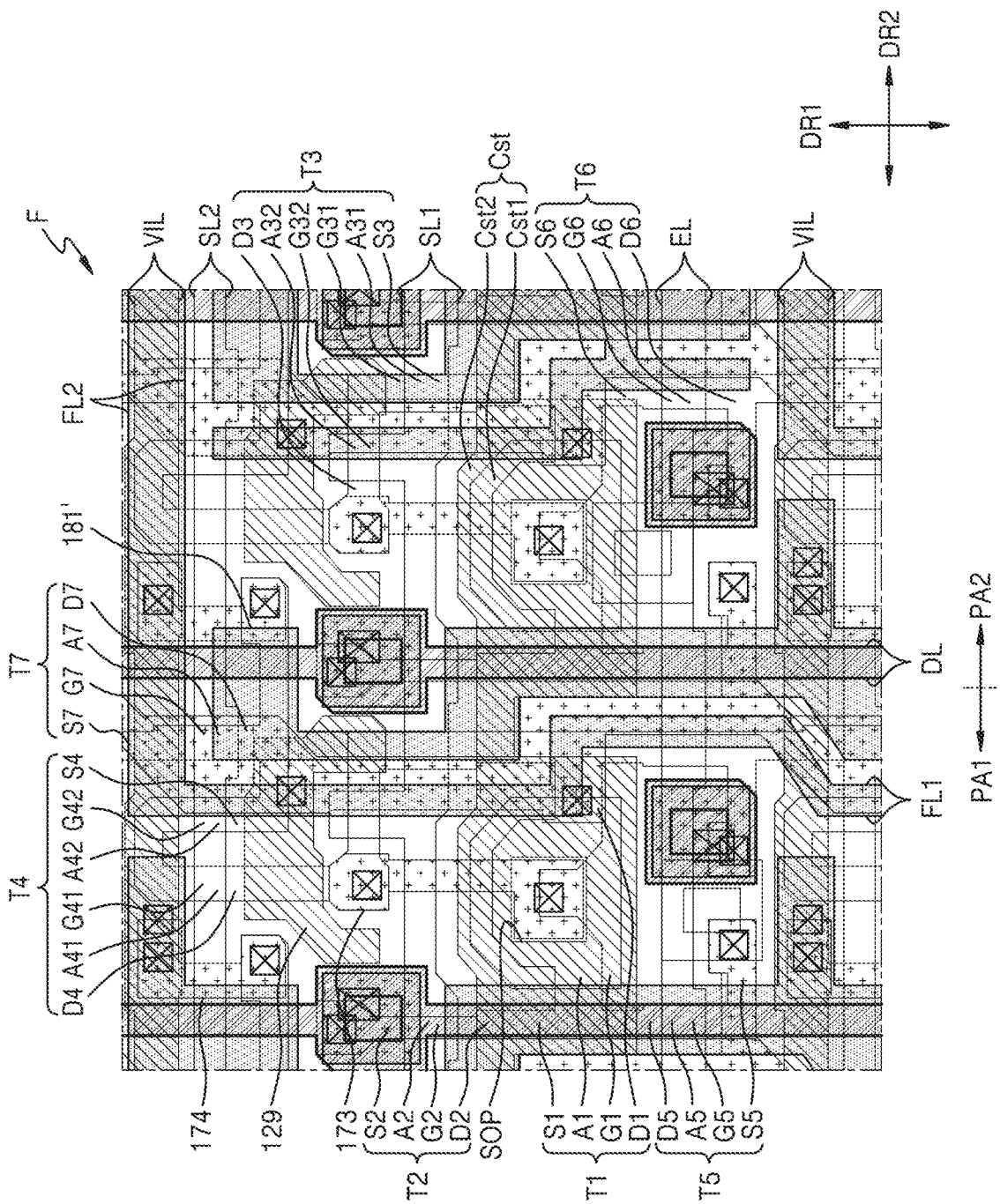
FIG. 16 is an enlarged view of region F of FIG. 15.
Figure 17:
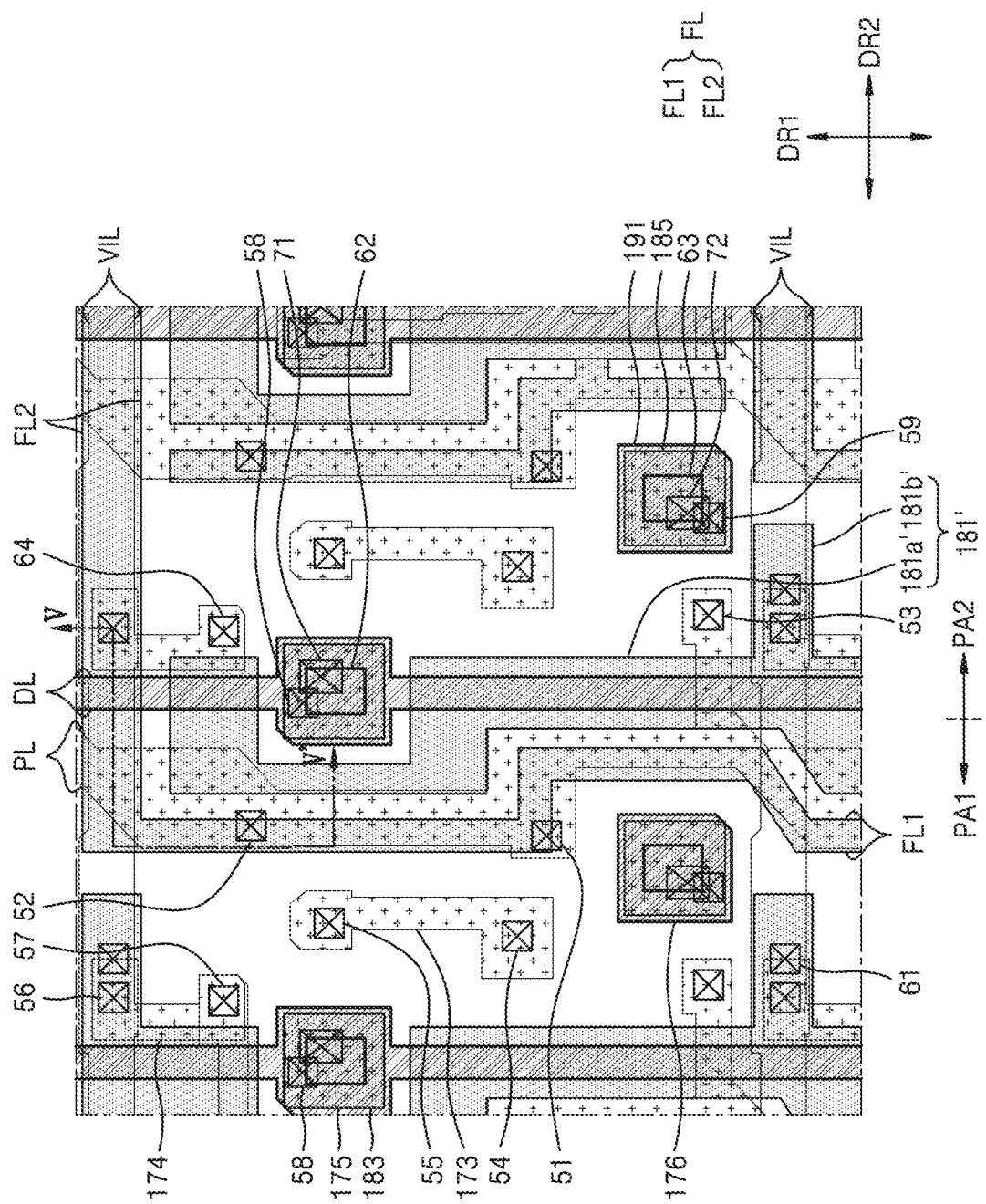
FIG. 17 is a layout diagram showing some lines of FIG. 16.
Figure 18:
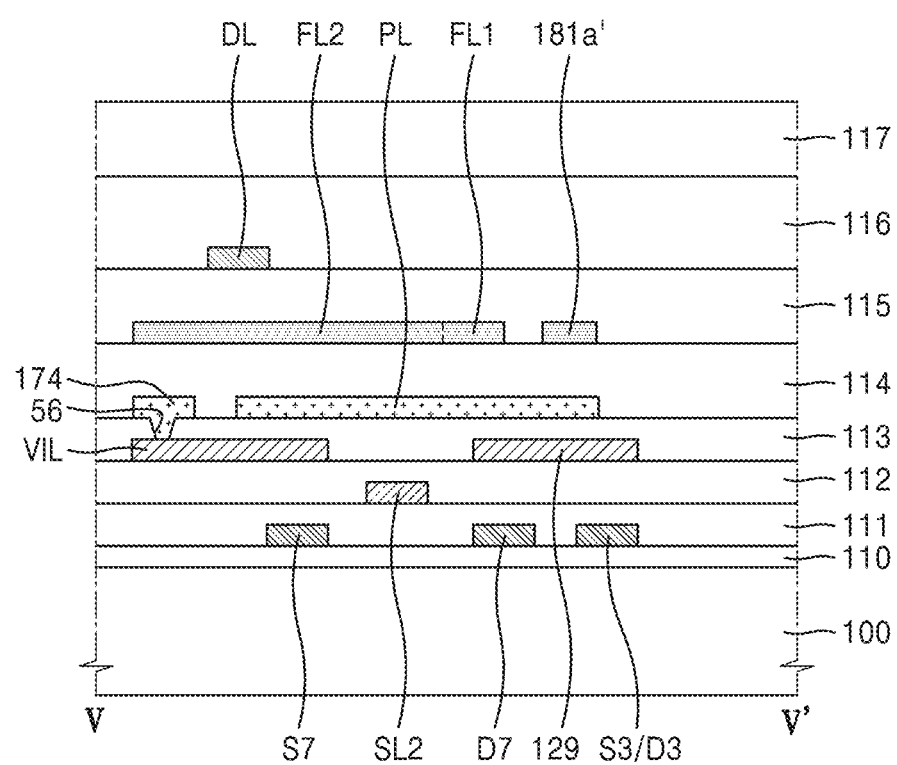
FIG. 18 is a schematic cross-sectional view taken along line V-V of FIG. 17.

FIG. 16 is an enlarged view of region F of FIG. 15. FIG. 17 is a layout diagram showing some lines of FIG. 16. FIG. 18 is a schematic cross-sectional view taken along line V-V' of FIG. 17. In FIG. 16, the same reference numerals as those of FIG. 6 represent the same elements and thus, a repeated description thereof will be omitted.

Referring to FIGS. 16 through 18, the fourth insulating layer 114 may be located on the power supply voltage line PL. The connection lines FL, a conductive layer 181', and the connection electrodes 183 and 185 may be arranged on the fourth insulating layer 114.

The connection lines FL may include the first portions FL1 extending in the first direction DR1 in the first sub-region SS1 and the second portions FL2 extending in the second direction DR2 in the second sub-region SS2. The first portions FL1 of the connection lines FL may overlap the power supply voltage line PL in a plan view. The second portions FL2 of the connection lines FL may overlap the initialization voltage line VIL. The connection lines FL may be bent at a border between the first sub-region SS1 and the second sub-region SS2 or near the border.

The conductive layer 181' may be apart from the adjacent first portions FL1 and the adjacent second portions FL2. The conductive layer 181' may include a first portion 181a' extending in the first direction DR1 and being in parallel with the power supply voltage line PL (i.e., having a corresponding contour with the power supply voltage line PL as shown in FIG. 17). The conductive layer 181' may further include a second portion 181b' that protrudes from the first portion 181a' in the second direction DR2 and overlaps the initialization voltage line VIL. The second portion 181b' of the conductive layer 181' may be connected to the connection electrode 174 via the contact hole 61 defined in the fourth insulating layer 114 and thus may be electrically connected to the initialization voltage line VIL. Thus, the initialization voltage VINT may be applied to the conductive layer 181' from the initialization voltage line VIL. The second portion 181b' of the conductive layer 181' may function as a horizontal pattern (see HP of FIG. 15).

The fifth insulating layer 115 may be located on the connection lines FL and the conductive layer 181'. The data line DL may be located on the fifth insulating layer 115.

In an exemplary embodiment of the present disclosure, the conductive layer 181' may be a shielding layer that is located on a layer between the power supply voltage line PL and the data line DL and blocks electrical signal interference between the power supply voltage line PL and the data line DL.

Figure 19:
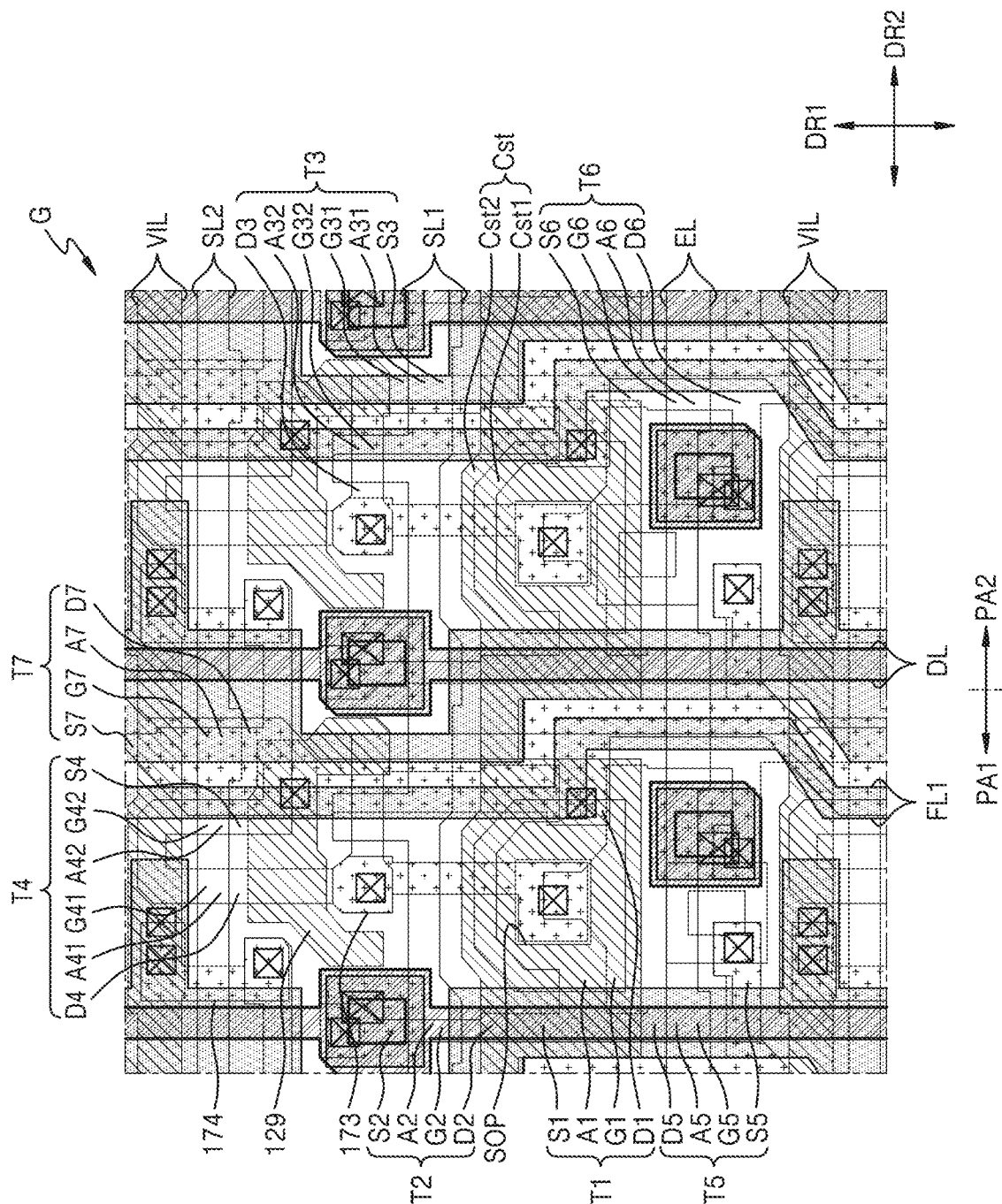
FIG. 19 is an enlarged view of region G of FIG. 15.
Figure 20:
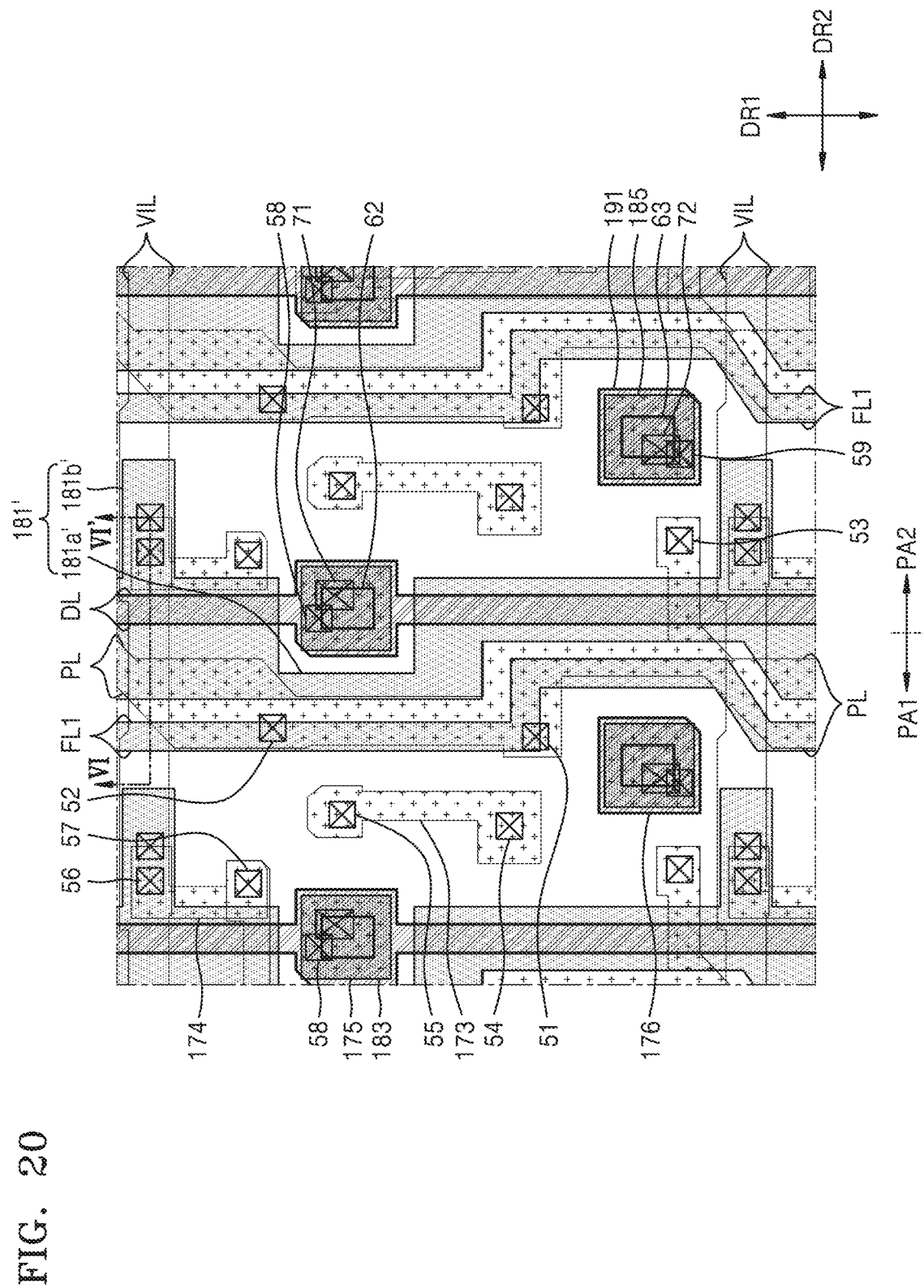
FIG. 20 is a layout diagram showing some lines of FIG. 19.
Figure 21:
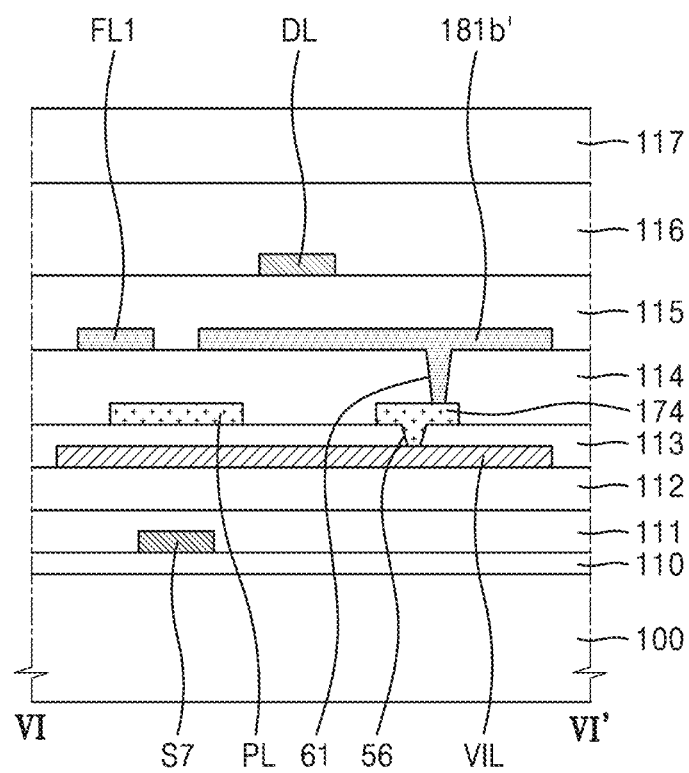
FIG. 21 is a schematic cross-sectional view taken along line VI-VI' of FIG. 20.

FIG. 19 is an enlarged view of region G of FIG. 15. FIG. 20 is a layout diagram showing some lines of FIG. 19. FIG. 21 is a schematic cross-sectional view taken along line VI-VI' of FIG. 20. In FIG. 19, the same reference numerals as those of FIG. 6 represent the same elements and thus, a repeated description thereof will be omitted. FIGS. 19 through 21 illustrate a pair of adjacent first portions FL1.

Referring to FIGS. 19 through 21, in the first sub-region SS1, a conductive layer 181' may be located between the pair of adjacent first portions FL1 on the plane. The first portion 181a' of the conductive layer 181' may be apart from the first portions FL1 of the connection lines and may extend in the first direction DR1 in parallel with the power supply voltage line PL (i.e., having a corresponding contour with the power supply voltage line PL as shown in FIG. 20). The second portion 181b' of the conductive layer 181' may be connected to the connection electrode 174 via the contact hole 61 defined in the fourth insulating layer 114 and thus may be electrically connected to the initialization voltage line VIL. The second portion 181b' of the conductive layer 181' may function as the horizontal pattern (see HP of FIG. 15).

The data line DL may be apart from the first portions FL1 of the connection lines and may extend in the first direction DR1. Part of the data line DL may overlap the first portion 181a' of the conductive layer 181'.

Figure 22:
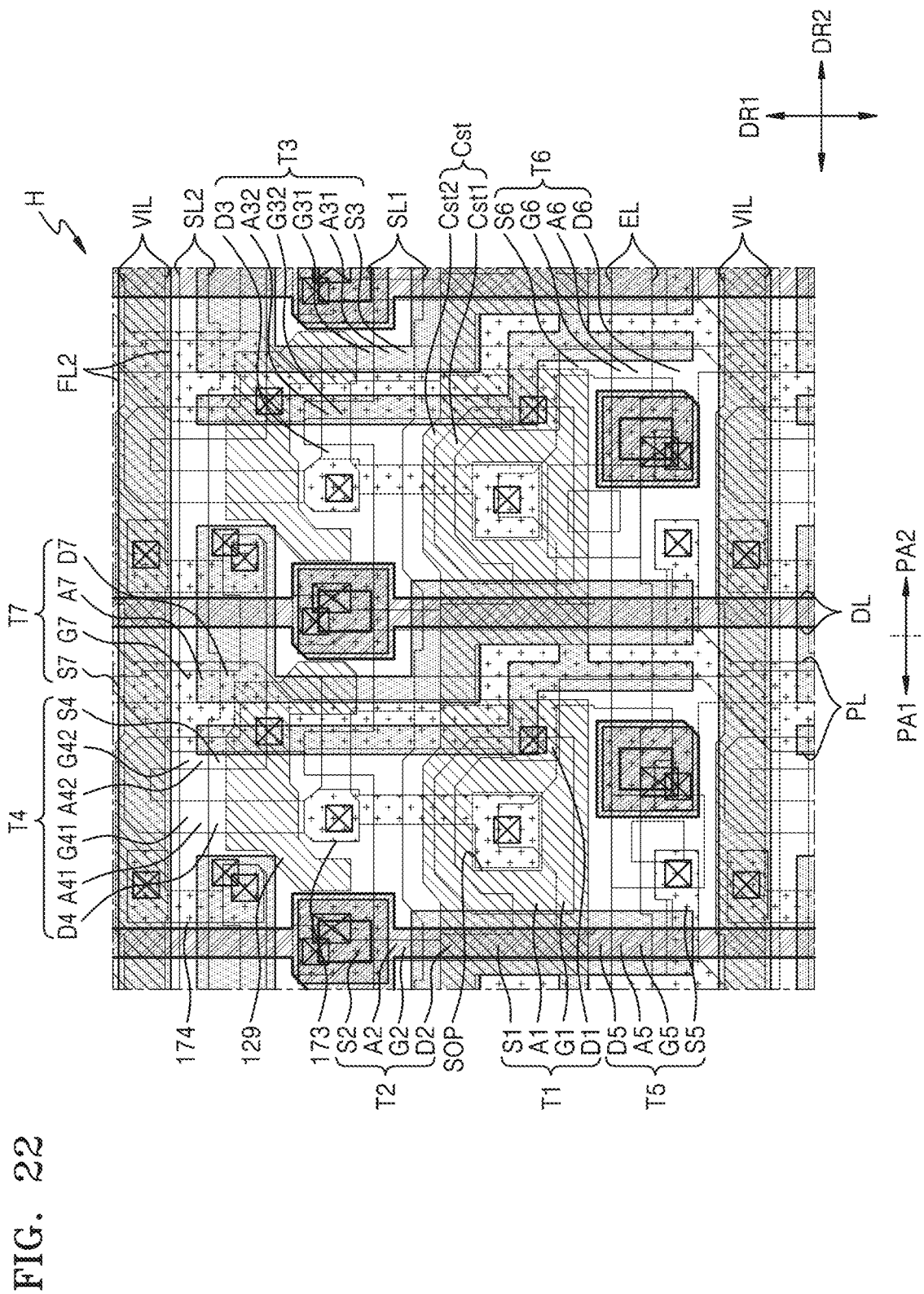
FIG. 22 is an enlarged view of region H of FIG. 5.
Figure 23:
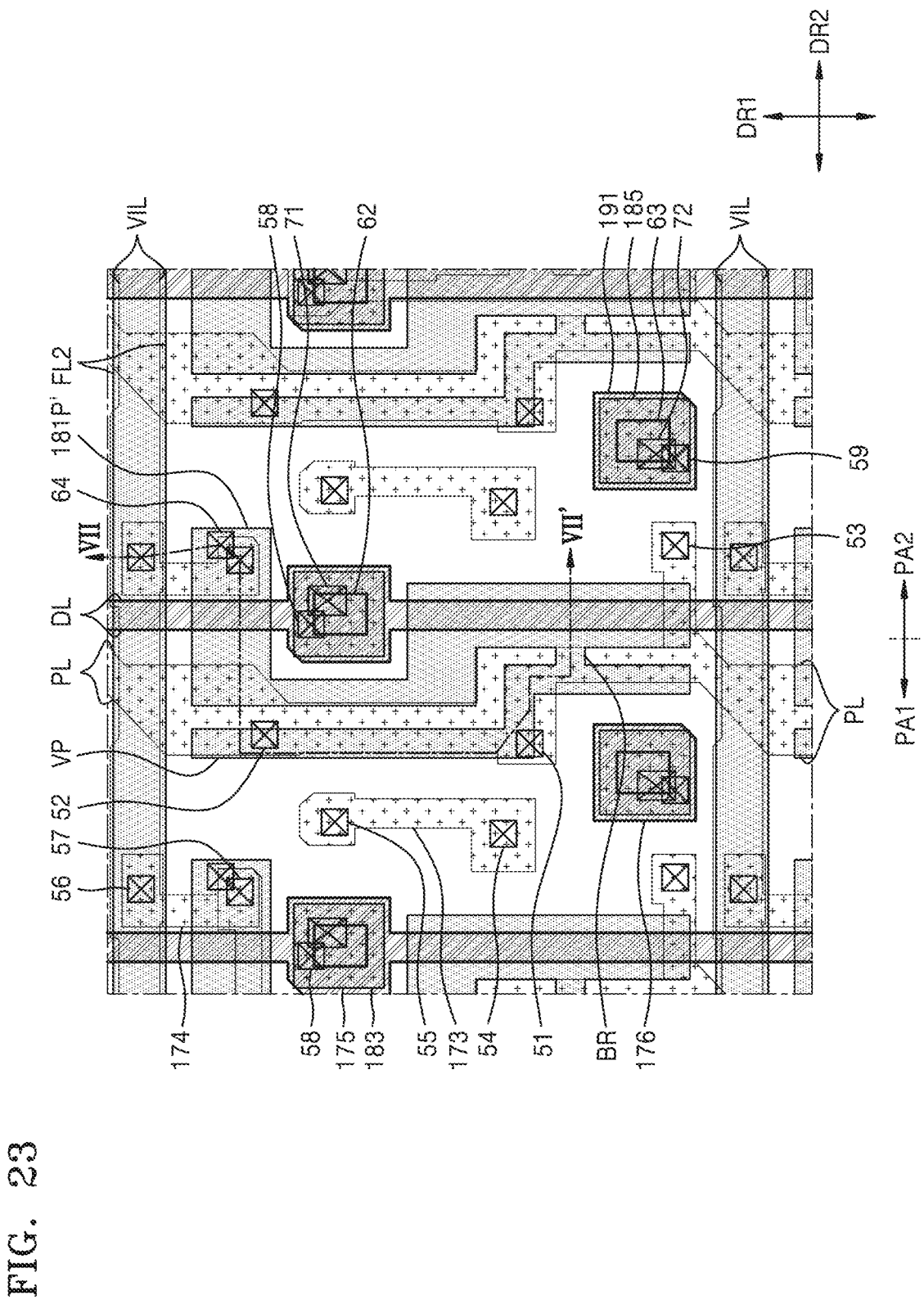
FIG. 23 is a layout diagram showing some lines of FIG. 22.
Figure 24:
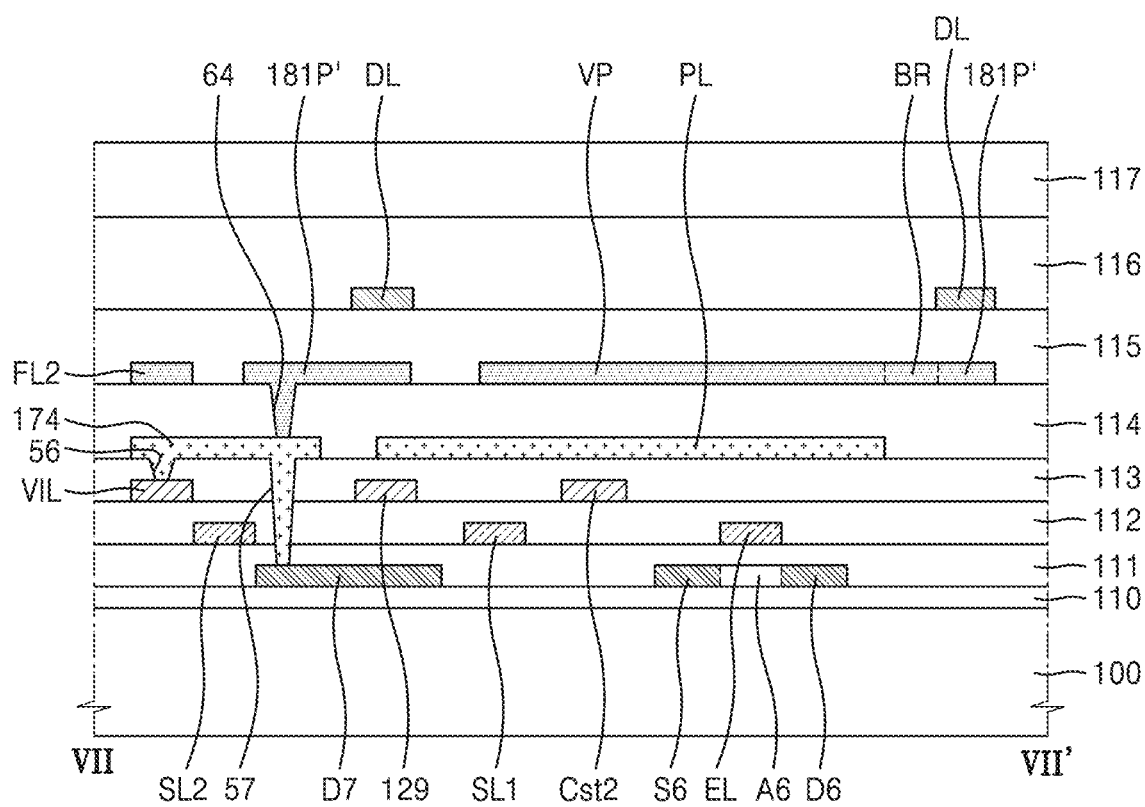
FIG. 24 is a schematic cross-sectional view taken along line VII-VII' of FIG. 23.

FIG. 22 is an enlarged view of region H of FIG. 15. FIG. 23 is a layout diagram showing some lines of FIG. 22 FIG. 24 is a schematic cross-sectional view taken along line VII-VII' of FIG. 23. In FIG. 22, the same reference numerals as those of FIG. 6 represent the same elements and thus, a repeated description thereof will be omitted. FIGS. 22 through 24 illustrate a pair of adjacent second portions FL2.

Referring to FIGS. 22 through 24, in the second sub-region SS2, a conductive pattern 181P' may be located between the pair of adjacent second portions FL2 on the plane. The conductive pattern 181P' may be located on the fourth insulating layer 114 together with the second portions FL2 of the connection lines and the vertical pattern VP.

The conductive pattern 181P' may extend in the first direction DR1, and part of the conductive pattern 181P' may overlap the power supply voltage line PL. The conductive pattern 181P' may be apart from the adjacent second portions FL2. Part of the conductive pattern 181P' may overlap the second end of the connection electrode 174 and may be electrically connected to the second end of the connection electrode 174 via the contact hole 64 defined in the fourth insulating layer 114. Thus, the initialization voltage VINT may be applied to the conductive pattern 181P' from the initialization voltage line VIL.

In the second sub-region SS2, the vertical pattern VP may be further located on the fourth insulating layer 114. The vertical pattern VP may be apart from the data line DL and may extend in parallel with the data line DL. The vertical pattern VP may overlap the power supply voltage line PL in a plan view. The vertical pattern VP may be located between the adjacent second portions FL2 and may be apart from the second portions FL2. The vertical pattern VP may be apart from the conductive pattern 181P', may extend in the first direction DR1 and may be connected to the conductive pattern 181P' via only a bridge BR. That is, the vertical pattern VP, the conductive pattern 181P', and the bridge BR may be integrally formed. Thus, the initialization voltage VINT may be applied to the vertical pattern VP from the initialization voltage line VIL.

The vertical pattern VP and the conductive pattern 181P' may include the same material as a material for forming the connection lines FL. The vertical pattern VP and the conductive pattern 181P' may include Mo, Al, Cu, and/or Ti and may have a multi-layer or single layer structure. In an exemplary embodiment, the vertical pattern VP and the conductive pattern 181P' may have a multi-layer structure of Ti/Al/Ti.

The data line DL on the conductive pattern 181P' may extend in the first direction DR1, and part of the data line DL may overlap the conductive pattern 181P' in a plan view.

In the exemplary embodiments described above, in the first sub-region SS1 of the first region (see SR1 of FIG. 1), the first portions FL1 of the connection lines FL have been described. However, the above-described layout may be applied to the third portions FL3 of the third sub-region (see SS3 of FIG. 1). Also, the layout of lines in the first region (see SR1 of FIG. 1) may be applied to the second region (see SR2 of FIG. 1). The connection lines are arranged even in the second region SR2 such that reflection (or scattering) characteristics of light become similar. Thus, the first region SR1 and the second region SR2 may not be distinguished from each other and thus may not be recognized.

According to an exemplary embodiment of the present disclosure, a display device that may prevent the quality of an image to be displayed from being degraded, may be implemented. The scope of the present disclosure is not limited by this effect.

It should be understood that exemplary embodiments described herein should be considered in a descriptive sense only and not for purposes of limitation. Descriptions of features or aspects within each exemplary embodiment should typically be considered as available for other similar features or aspects in other exemplary embodiments. While one or more exemplary embodiments have been described with reference to the figures, it will be understood by those of ordinary skill in the art that various changes in form and details may be made therein without departing from the spirit and scope as defined by the following claims.

What is claimed is:

1. A display device comprising:
   a substrate comprising a display area in which a display element is arranged and a non-display area having a pad area outside the display area;
   a first thin-film transistor arranged in the display area and comprising a first semiconductor layer and a first gate electrode insulated from the first semiconductor layer;
   a first voltage line which extends in a first direction on the first gate electrode;
   a data line apart from the first voltage line and which extends in the first direction;
   a connection line arranged in the display area and which connects the data line to a pad in the pad area; and
   a conductive layer arranged in a layer between the first voltage line and the data line,
   wherein the connection line comprises a first portion and a second portion, the first portion extends in the first direction and is arranged in a same layer as the data line, the second portion extends in a second direction crossing the first direction, and the first portion and the second portion are electrically connected to each other within the display area, and
   wherein the first voltage line is disposed between the data line and the substrate.

2. The display device of claim 1, further comprising a second voltage line in a layer between the first gate electrode and the first voltage line, wherein the second voltage line extends in the second direction and overlaps the second portion of the connection line in a plan view.

3. The display device of claim 2, wherein the conductive layer is electrically connected to the second voltage line.

4. The display device of claim 2, further comprising:
   a second thin-film transistor comprising a second semiconductor layer and a second gate electrode insulated from the second semiconductor layer;
   a node electrode which electrically connects the first gate electrode of the first thin-film transistor to a first end of the second semiconductor layer of the second thin-film transistor; and
   a connection electrode which electrically connects the second voltage line to a second end of the second semiconductor layer of the second thin-film transistor.

5. The display device of claim 2, further comprising an electrode layer located on and overlapping the first gate electrode, and arranged in a same layer as the second voltage line.

6. The display device of claim 5, wherein the first voltage line is electrically connected to the electrode layer.

7. The display device of claim 1, further comprising:
   a first planarization layer between the first voltage line and the second portion of the connection line; and
   a second planarization layer between the second portion and the first portion of the connection line.

8. The display device of claim 7, wherein the conductive layer overlaps the first voltage line in a plan view, and the first portion of the connection line overlaps the conductive layer.

9. The display device of claim 1, wherein a part of the data line overlaps the conductive layer in a plan view.

10. The display device of claim 1, wherein the connection line further comprises a third portion extending in the first direction in the display area and connected to the pad, and the data line is connected to the first portion in the non-display area.

11. A display device comprising:
a substrate comprising a display area in which a display element is arranged and a non-display area having a pad area outside the display area;
a first thin-film transistor arranged in the display area and comprising a first semiconductor layer and a first gate electrode insulated from the first semiconductor layer;
a first voltage line which extends in a first direction on the first gate electrode;
a data line apart from the first voltage line and which extends in the first direction;
a connection line arranged in the display area and which connects the data line to a pad in the pad area; and
a conductive layer arranged in a layer between the first voltage line and the data line,
wherein the connection line is arranged in a same layer as the conductive layer and the connection line comprises a first portion extending in the first direction and a second portion extending in a second direction crossing the first direction, and
wherein the first voltage line is disposed between the data line and the substrate.

12. The display device of claim 11, further comprising a second voltage line in a layer between the first gate electrode and the first voltage line, wherein the second voltage line extends in the second direction and overlaps the second portion of the connection line in a plan view.

13. The display device of claim 12, wherein the conductive layer is electrically connected to the second voltage line.

14. The display device of claim 12, further comprising:
a second thin-film transistor comprising a second semiconductor layer and a second gate electrode insulated from the second semiconductor layer;
a node electrode which electrically connects a first gate electrode of the first thin-film transistor to a first end of the second semiconductor layer of the second thin-film transistor; and
a connection electrode which electrically connects the second voltage line to a second end of the second semiconductor layer of the second thin-film transistor.

15. The display device of claim 12, further comprising an electrode layer located on and overlapping the first gate electrode, and arranged in a same layer as the second voltage line.

16. The display device of claim 15, wherein the first voltage line is electrically connected to the electrode layer.

17. The display device of claim 11, further comprising:
a first planarization layer between the first voltage line and the connection line; and
a second planarization layer between the connection line and the data line.

18. The display device of claim 11, wherein the first portion of the connection line overlaps the first voltage line in a plan view.

19. The display device of claim 11, wherein a part of the data line overlaps the conductive layer in a plan view.

20. The display device of claim 11, wherein the connection line further comprises a third portion extending in the first direction in the display area and connected to the pad, and
the data line is connected to the first portion in the non-display area.

* * * * *